United States Patent [19]

Scheinbeim et al.

[11] Patent Number: 5,336,422
[45] Date of Patent: Aug. 9, 1994

[54] POLARIZED PRODUCTS AND PROCESSES

[75] Inventors: Jerry I. Scheinbeim, Somerset; Brian N. Newman, Highland Park; Jar W. Lee, East Brunswick, all of N.J.; Yoshihiko Takase, Shiroishi, Japan

[73] Assignee: Rutgers, The State University of New Jersey, New Brunswick, N.J.

[21] Appl. No.: 854,189

[22] Filed: Mar. 20, 1992

Related U.S. Application Data

[63] Continuation-in-part of Ser. No. 360,788, Jun. 2, 1989, Pat. No. 5,204,013, which is a continuation-in-part of Ser. No. 62,014, Jun. 25, 1987, Pat. No. 4,863,648, which is a continuation-in-part of Ser. No. 881,828, Jul. 3, 1986, Pat. No. 4,830,795.

[51] Int. Cl.$^5$ .............................................. C04B 35/00
[52] U.S. Cl. .................................................... 252/62.9
[58] Field of Search ......................................... 252/62.9

[56] References Cited

U.S. PATENT DOCUMENTS

| | | | |
|---|---|---|---|
| 4,393,093 | 7/1983 | Sprout, Jr. | 264/22 |
| 4,486,683 | 12/1984 | Newman et al. | 264/22 |
| 4,606,871 | 8/1986 | Krueger et al. | 264/22 |
| 4,615,848 | 10/1986 | Krueger et al. | 264/22 |
| 4,830,795 | 5/1989 | Scheinbeim et al. | 264/22 |
| 4,863,648 | 9/1989 | Scheinbeim et al. | 264/22 |

Primary Examiner—Ellen M. McAvoy
Attorney, Agent, or Firm—Leroy G. Sinn

[57] ABSTRACT

This invention relates to a polarized material which has polarization which is essentially stable up to the crystal melting temperature range of the polar crystals or to the softening temperature range or the glass transition temperature range of the polarized material if it is non-crystalline. A preferred polarized material provided is poly(vinylidene fluoride), blends of poly(vinylidene fluoride) and vinylidene copolymer and blends of odd Nylons such as Nylon-7 and Nylon-11.

27 Claims, 31 Drawing Sheets

POLARIZED PRODUCTS AND PROCESSES

This invention was made with Government support under the Office of Naval Research, Grant No. NOOO14-80C-0795, and the U.S. Government has certain rights in the invention.

CROSS-REFERENCE TO RELATED APPLICATION

This application is a continuation-in-part of U.S. application Ser. No. 07/360,788 filed Jun. 2, 1989, which is a continuation-in-part of U.S. application Ser. No. 07/062,014, filed Jun. 25, 1987, now U.S. Pat. No. 4,863,648; which was a continuation-in-part of U.S. application Ser. No. 06/881,828, filed Jul. 3, 1986, now U.S. Pat. No. 4,830,795.

TECHNICAL FIELD

This invention relates to a process for making polarized material with a polarization. It provides an improved and more efficient process for making such materials and is particularly useful for making polymeric materials or material products with piezoelectric and pyroelectric properties. Also, by this invention is provided a polarized material which is essentially stable up to its crystal melting point or its softening point, if the polarized material is non-crystalline. The polarized material is substantially free of mechanically-induced orientation and has mechanical and electromechanical properties isotropic in a plane perpendicular to the poling field direction.

Certain materials such as various polymeric materials are capable of being polarized when subjected to mechanical or electrical stresses. In the past, it has been found that a polymeric material such as poly(vinylidene fluoride) can be polarized by stretching a sheet at a temperature of about 70° C. at least three times its length, and subjecting the stretched sheet to a DC field of at least 1 MV/cm. Poly(vinylidene fluoride) has been a preferred material for polarization, since it has been found to have a high capability of polarization response, thereby providing high piezoelectric or pyroelectric properties or highly desired optical properties. Subjecting such a stretched film, for example, using an appropriate DC field applied in a direction perpendicular to the plane of the stretched film causes an orientation of the molecular dipoles of the materials. In the case of poly(vinylidene fluoride), the fluoro groups have a negative charge and the hydrogen atoms attached to the other carbon of the vinylidene fluoride unit of the polymer have a positive charge. Vinylidene fluoride units in a poly(vinylidene fluoride) can exist in at least two different crystalline forms. In one form, the vinylidene fluoride units exist in a planar zigzag polar form or trans form (beta form or Form 1). In another form, the form is nonpolar and nonplanar; it is a T-G-T-G' form (alpha form or Form 2) wherein T denotes trans configuration and G and G' denote the two types of gauche forms. In the past, the desired increase in Form 1 has been realized by subjecting poly(vinylidene fluoride) films (PVF$_2$ films) to stretching and subsequently subjecting the stretched films to high DC fields over extended periods of time at high temperatures. Such treatment with a DC field is referred to as "poling". It is desired to have a high content of Form 1 in order to have the highest amount of desired polarization properties, for example, piezoelectric and pyroelectric properties. The polarized material is cooled after poling for purposes of retaining the polarization.

Such polarized materials are used, for example, in making transducers, which utilize the piezoelectric or pyroelectric or other polarization properties of such polarized materials.

Various other polarizable polymers having various groups such as fluoro, chloro, amide, ester, cyanide, carbonate, nitrile, ether, and the like, such as polyvinylchloride (PVC), polyvinylfluoride (PVF), vinylidene fluoride copolymers, and many other polymer materials have the capability of being polarized as do various non-polymeric materials such as some ceramic materials.

Customary stretching in the film direction causes an unequal (or anisotropic) elastic modulus in the stretching or axial direction (X-X$^1$) as compared to the transverse direction (Y-Y$^1$). This is undesirable. It is desired to provide materials which are free or substantially free of such mechanically induced orientation and which have a polarization which is stable up to the crystal melting point or material softening point, in the case of non-crystalline polarized materials. Such materials are substantially free of said anisotropic mechanical properties. Such polarized materials and processes for producing such polarized materials are highly desired.

SUMMARY OF INVENTION

A process has been found by which highly polarized materials can be produced which are free or substantially free of mechanically-induced orientation and which polarization is essentially stable up to about the crystal melting temperature range (glass transition temperature) of the polarized material or up to about the softening temperature range or glass transition temperature range of the polarized material in the case of non-crystalline polarized material. The process comprises dissolving a material to be polarized in a solvent or solvents for that material. The solvent is selected which is adapted to the polarization of the material and which can be removed to the extent desired by evaporation during the course of the polarization or prior to or subsequent to the polarization. The temperature employed will be one at which polarization effectively occurs, ordinarily at an elevated temperature at which no substantial dielectric breakdown occurs. The DC field employed in the polarization will be selected which provides the desired polarization.

Also provided by this invention are polarized products which are free or substantially free of mechanically induced orientation and which are essentially stable up to about the crystal melting point of the material or in the case of non-crystalline material up to about the softening temperature range or glass transition temperature range of the material. The material presently preferred is poly(vinylidene fluoride) or certain copolymers of vinylidene fluoride.

One embodiment of the invention provides a polarized material which is characterized as follows:

1) is free or substantially free of mechanically-induced molecular orientation;

2) has polarization which is essentially stable to about the crystal melting temperature range of the polar crystals of the material or to about the softening temperature range or glass transition temperature range of the material if it is non-crystalline; and 3) has mechanical and electromechanical properties isotropic or substantially isotropic in a plane perpendicular to the poling field direction; said polarized material being a composition comprising essentially all or all of said polarized material.

The invention further provides a polarized material which is characterized as having polarization which is essentially stable to about the crystal melting temperature range of the polar crystals of the material or to about the softening temperature range or glass transition temperature range of the material if it is non-crystalline.

The invention still further provides a method for preparing polarized material which comprises the following steps:

a) providing a melted composition of one or more polymers in the form of a film capable of being polarized in a preselected form;

b) quenching the melted polymeric composition;

c) cold drawing the polymeric composition;

d) polarizing the cold drawn polymeric composition by applying an effectively high electric field which is of less intensity than that which would cause substantial dielectric breakdown of the polymeric composition; and e) annealing the polarized polymeric composition at an annealing temperature less than the melting temperature of the crystals of the polarized polymeric composition whereby the polarization is retained and a thermal stability of the polarization is provided at or near the crystal melting point of the polar crystals of the polymeric composition.

DETAILED DESCRIPTION OF THE INVENTION AND THE PREFERRED EMBODIMENTS

The process is carried out by first dissolving the material to be polarized in the required amount of a suitable solvent or solvents to form a solution. For example, if poly(vinylidene fluoride) is selected as the material, a suitable solvent such as tricresylphosphate can be used. It has been found that about five parts of a poly(vinylidene fluoride), which is suitable for making a polarized film, is an acceptable amount to dissolve in 95 parts of tricresylphosphate or another polarization solvent for making the solution for polarization. The mixture is heated to about 180°–190° C. to aid dissolution. It has been found that a capacitor grade poly(vinylidene fluoride) as sold by Kureha Kagoku Kogko Kabishiki Kaisha is suitable.

Ordinarily, it is preferred to reduce the solvent content in the solution prior to commencement of polarization. For example, in the case of poly(vinylidene fluoride)/tricresylphosphate solution, the solvent content can be reduced from 95 parts to 50 parts or below such as to 23.5 parts as shown in FIG. 2 or lower providing the poly(vinylidene fluoride) remains in solution.

The solution with the reduced solvent content then is preferably placed in a press under a suitable pressure of 2500 to 3500 psi at an elevated temperature below the degradation temperature of the polymer; for example, it has been found suitable to use a pressure of 3000 psi and a temperature of 185° C. The film then is preferably cooled rapidly as by immersion in an ice bath.

Figure 1:
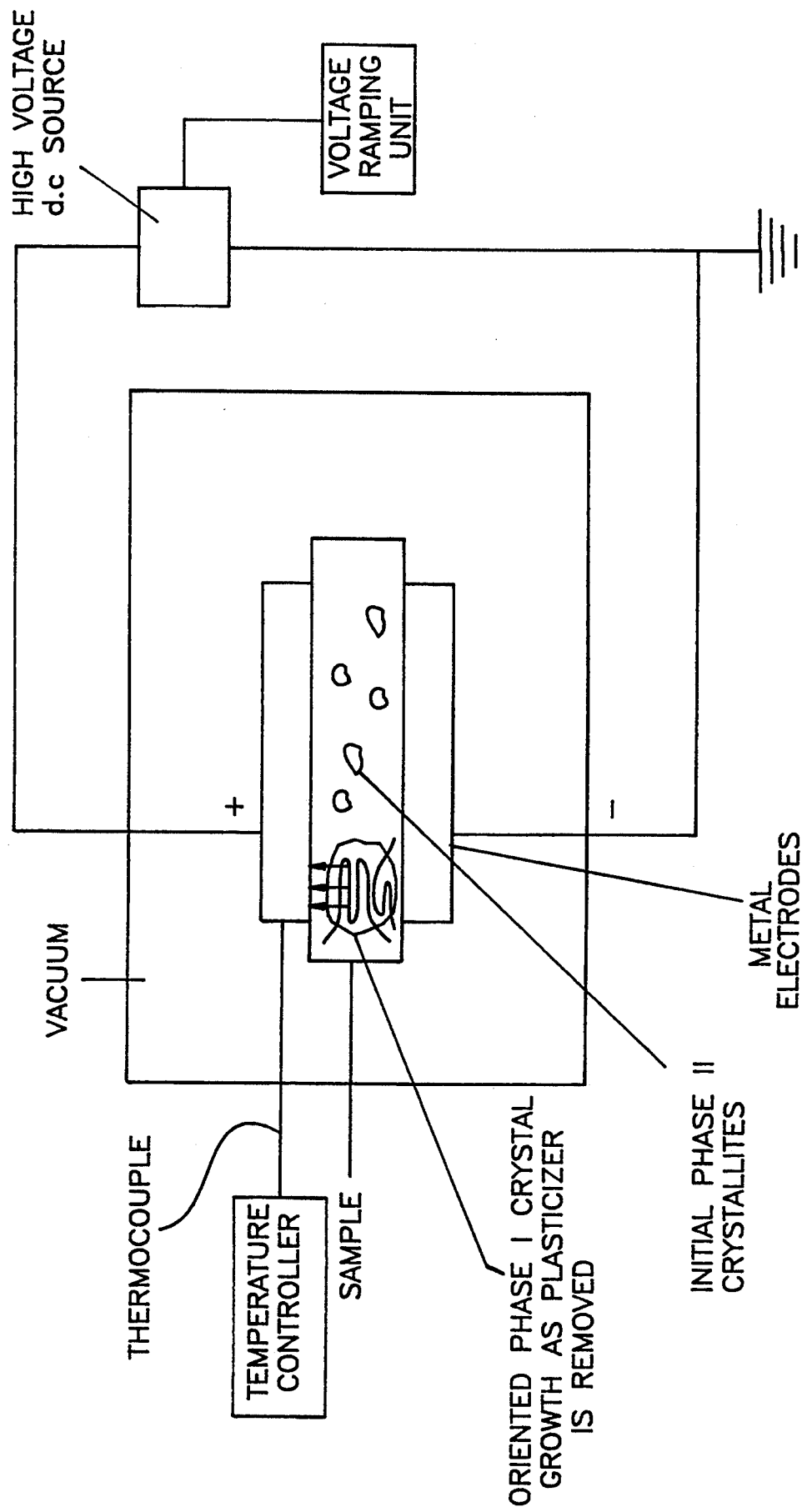
FIG. 1 is a schematic representation of an apparatus used to provide the DC field for the polarization of the material and to provide as desired for removal of solvent by evaporation during poling.

As shown in FIG. 1, the solution of poly(vinylidene fluoride) with the reduced solvent content can be placed into a suitable vacuum oven which is equipped with an appropriate DC source. The poly(vinylidene fluoride) solution is placed between two suitable electrodes. Polished copper plates can be used as the electrodes. The electric field is provided. Temperature is adjusted as desired. A temperature can be used which will provide a high rate of removal of the solvent and a high rate of polarization without substantial dielectric breakdown of the material being polarized. The solvent content can be reduced if desired by evaporation prior to poling and can be further reduced after poling, if desired.

Figure 2:
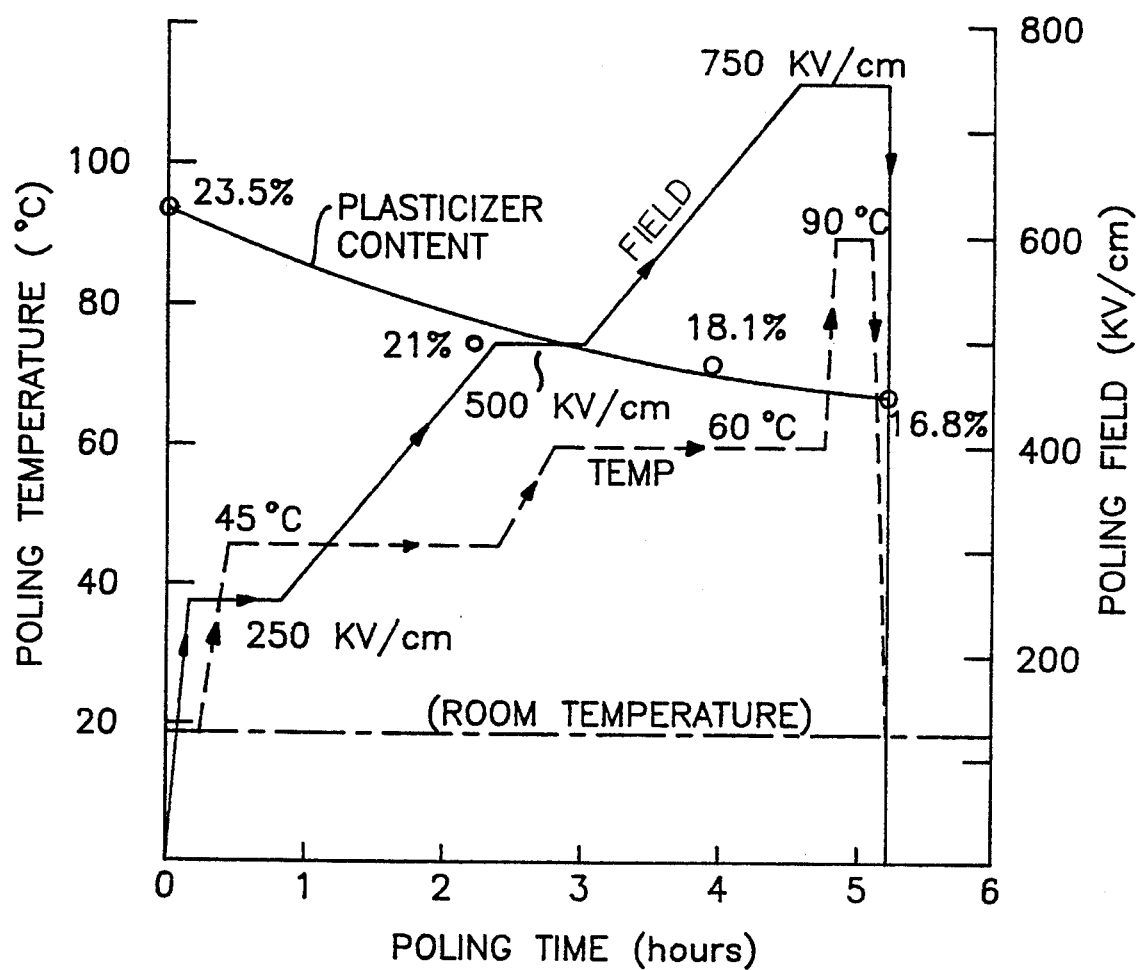
FIG. 2 is a graph showing the DC field, the content of solvent present and the temperature of polarization in illustration of the process in which poly(vinylidene fluoride) is used as the polarized material.

The process can be carried out to provide a desired polarized poly(vinylidene fluoride) film as shown in FIG. 2.

The solvent can be reduced in the polarized material as desired. However, it has been found that retaining a small amount of solvent in the polarized material provides desirable improvement in the dielectric constant. For example, the dielectric constant of the poly(vinylidene fluoride) film can thereby be increased by up to about 400 percent, preferably from about 50 percent to about 300 percent and still retain an essentially stable polarization up to the crystal melting temperature range or to the softening temperature range of glass transition temperature range of the material used in the polarization process, as the case might be.

Figure 3:
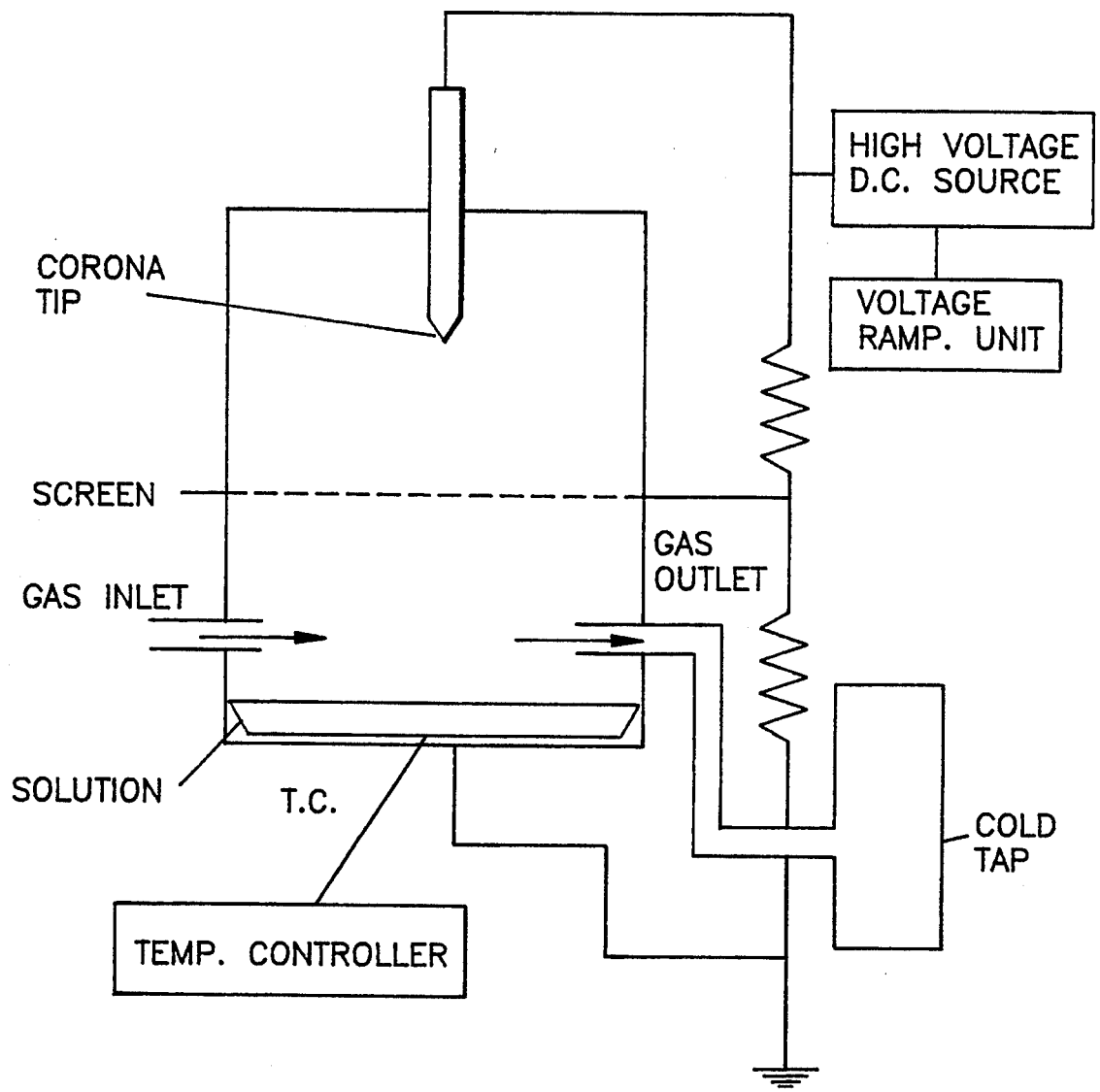
FIG. 3 is a schematic representation of an apparatus for carrying out the invention by which the electric field is provided by corona discharge and the solvent can be removed by passing a solvent over the surface of the solution of the material to reduce solvent content as desired.

The poling can also be carried out using corona discharge to provide the electrical field. As shown in FIG. 3, a conventional corona discharge apparatus can be used. The grid as shown in FIG. 3 is placed above the solution of material to be polarized. As shown in FIG. 3, the solvent content can be reduced during the polarization by passing a flow of a suitable gas over the surface of the film. It has been found that nitrogen ordinarily is a suitable gas for this purpose. The gas with the uptaken solvent can be processed in a conventional manner to remove or reduce the content of solvent and the gas can be passed in a continuous manner again over the film being polarized. If desired, the solvent content of the solution can be reduced prior to poling and then can be further reduced after poling if desired.

Also, the process can be made continuous by placing the solution film on a moving conveyor in suitable arrangement of corona discharge elements together with an appropriate means of solvent removal, as a passage of a suitable gas over the surface of the material solution, if solvent removal is desired during poling. The intensity of the electric field used will ordinarily be selected to provide efficient polarization. However, it will be kept below the range at which substantial dielectric breakdown of the material being polarized occurs. In the case of poly(vinylidene fluoride), it has been found that an electrical field of 250 KV/cm is satisfactory to pole a poly(vinylidene fluoride) film solution having a 23.5 percent solvent content, as shown in FIG. 3. Also, it is shown in FIG. 3 that the electrical field could satisfactorily be increased to 500 KV/cm as the solvent content decreased and increased further to 750 KV/cm when the solvent content is reduced to about 16 percent. The initial electrical field could have been reduced below 250 KV/cm such as to 50–200 KV/cm; however, using lower electrical fields than those in a maximum range results in less efficient polarization. Under the conditions of FIG. 3, the further increase of the electrical field beyond 750 KV/cm at 16 percent solvent can result in some dielectric breakdown, for example, in the range of about 800 to about 1000 KV/cm. Care should be exercised to stay below an electrical field of such intensity that dielectric breakdown of the material occurs. The electrical field at which substantial breakdown occurs can be determined by preliminary experimentation.

The temperature at which the polarization process is carried out depends upon the desired rate at which polarization occurs, the material used, the solvent used, the equipment available for polarization, the desired level of solvent wished to be retained in the final polarization material and other factors. As is shown in FIG. 3, a starting poling temperature of 45° C. is used satisfactorily. The temperature is increased to 60° C. and finally the temperature of 90° C. is used when solvent content is reduced to about 16 percent. Obviously, the poling temperature should be maintained lower than the boiling point of the solvent under the conditions used.

Materials which can be used in this invention can vary widely so long as they have a polarization capability. As mentioned above, a preferred material is poly(vinylidene fluoride). Copolymers of vinylidene fluoride are also desirable materials, such as vinylidene fluoride copolymers with vinyl fluoride, trifluoroethylene, tetrafluoroethylene, vinyl chloride, methylmethacrylate, and others. The vinylidene fluoride content can vary in the range of from about 30 percent to about 95 percent based on the total polymer weight. Other polymers which can be used are polyvinylchloride, polymethylacrylate, polymethylmethacrylate, vinylidene cyanide/vinyl acetate copolymers, vinylidene cyanide/vinyl benzoate copolymers, vinylidene cyanide/isobutylene copolymers, vinylidene cyanide/methyl methacrylate copolymers, polyvinylfluoride, polyacrylonitrile, polycarbonate, and Nylons such as Nylon-7 and Nylon-11, natural polymers such as cellulose and proteins, synthetic polymers such as derivatives of cellulose, such as esters and ethers, poly (gamma-methyl-L-glutamate), and the like. Also, polarizable materials which are soluble ceramic materials and capable of forming polar crystals or glasses can be used together with an appropriate polarization solvent for particular soluble ceramic material used.

A variety of suitable solvents can be used depending upon the material used in the polarization, cost and safety consideration, equipment used, and other factors. In the use of poly(vinylidene fluoride) material, tricresylphosphate has been found to be a suitable solvent. It is also suitable for use when many copolymers of vinylidene fluoride are used. Dibutyl phthalate can also be used as the solvent for these vinylidene polymers. In the use of Nylon-7 and Nylon-11, 2-ethyl-1, 3-hexanediol can be used. Other solvents can be used depending upon the polymer material used and other factors and will be suggested to those skilled in the art.

The term solution as used herein has its usual meaning of a mixture of two or more elements or compounds which appear to be homogeneous even to the highest possible magnification of visible light. *The Encyclopedia of Chemistry*, 2nd ed., Ed. George L. Clark, Reinhold Publishing Corporation, New York, N.Y., 1966, page 989.

Figure 4:
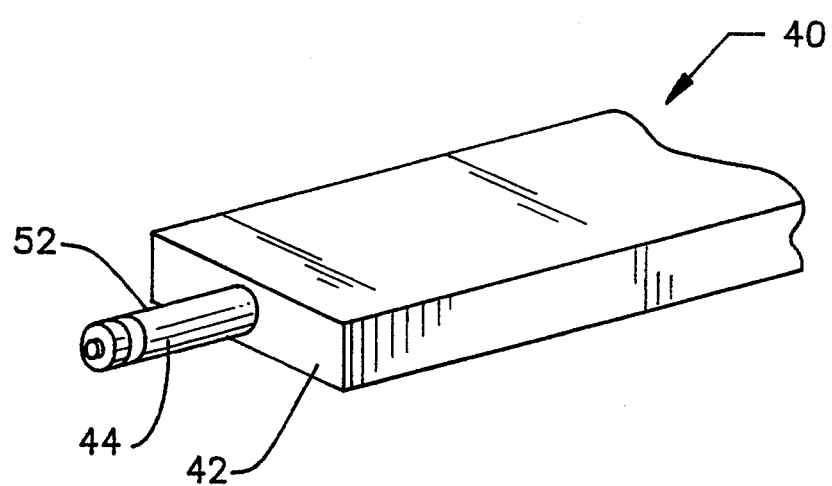
FIG. 4 is a perspective view of a transducer using polarized poly(vinylidene fluoride) film made by the process of this invention as the active piezoelectric material.

Polarized materials provided by this invention can be used in making transducers having standard transducer configurations. FIG. 4 shows a perspective view of a transducer 40 using polarized poly(vinylidene fluoride) film as the active piezoelectric material. Transducer 40 includes a long and flat outer layer 42 and a piezoelectric cable 44 is enveloped in outer layer 42. Piezoelectric cable 44 is provided with a piezoelectric layer or sheet 46 of poly(vinylidene fluoride) rolled on the outer periphery of a center electrode 50 which is made of a thin metallic wire. The outer electrode 52 made of a thin metallic film is formed on the outer periphery of layer 46. In operation, when pressure induced by an acoustic signal is exerted on the outer layer 42, it is transmitted to layer 46 of poly(vinylidene fluoride) and electric potential is generated between electrodes 50 and 52. Conversely, a pressure wave is generated by the transducer when an electrical signal is applied between the two electrodes 50 and 52.

In one preferred embodiment, materials comprising one or more odd Nylons, i.e. Nylon-3, Nylon 5, Nylon 7, Nylon-9 or Nylon-11, or especially a composition of Nylon-7/Nylon-11, most preferably a 50:50 by weight composition of Nylon-7/Nylon-11. Compositions containing more than one polymer can be prepared by forming them into solution, melting them together, co-extrusion and forming a multiphase composition. They can either be formed into a self-supporting sheet or adhered to a substrate. Poling may be conducted, for example, using a field of at least 1 Mv/cm at from about 20° C. to about 120° C. for up to about 5 hours. Annealing may be conducted, for example, at a temperature of up to the melt temperature of the film, preferably, from about 185° C. to about 200° C. for at least one hour, and usually for 1.5 to about 2.5 hours. These films can be made to exhibit significant piezoelectric activities at temperatures in the 100° C. to 200° C. range or more preferably in the 175° C. to 200° C. range. This is significant since many other polymers exhibiting piezoelectric activity either lose their piezoelectric activity or actually melt at these elevated temperatures. Annealing serves to fix, stabilize and lock-in the polarization. This piezoelectric polymer material which shows excellent high temperature thermal stability permits its use as sensors in high temperature applications such as engine compartment sensors, high temperature accelerometers, active skin applications for acoustic damping, smart skin for aircraft, and inter-layer sensors in reinforced composite laminated materials to provide stress and strain sensing in the laminate which must be cured at elevated temperatures of above 200° C.

Measurements of piezoelectric strain constant, $d_{31}$, piezoelectric stress constant, $e_{31}$, pyroelectric constant, $p_y$, dielectric constant and dynamic mechanical modulus were determined in conventional manner (measured at 3 Hz). The percentages of crystallinity are determined by x-ray diffractometer scans. Certain additives or dopants can be incorporated into the polarized materials of this invention to provide certain additional properties so long as their presence does not substantially interfere with the desired properties of the polarized materials provided by this invention.

EXAMPLE 1

Five parts of Kureha capacitor grade poly(vinylidene fluoride) ($PVF_2$) film are dissolved in 95 parts of tricresylphosphate at 185° C. The solution is transferred to a tray and placed into a vacuum oven. The oven is maintained at a vacuum of about $10^{-3}$ torr and at a temperature within the range of 150° C.–200° C. until a $PVF_2$ solution is obtained having about 70 percent by weight of $PVF_2$ and 30 percent by weight of tricresylphosphate. The $PVF_2$ solution is transferred as a film to a press, subjected to a pressure of 3000 psi and heated to 185° C. The film is then rapidly cooled by immersion into an ice bath. The $PVF_2$ solution film now comprises 76.5 percent by weight of $PVF_2$ and 23.5 percent by weight of tricresylphosphate. The film having a thickness of about 1 mil is transferred to a poling apparatus of the type depicted in FIG. 1 between two polished copper plates, is connected to a high voltage DC supply, and then is placed under high vacuum ($\sim 10^{-6}$ torr). The $PVF_2$ solution film is poled as shown in FIG. 2 at 250 KV/cm at 45° C. for about 45 minutes, at which point the field is linearly increased to 500 KV/cm at poling time of about 2.3 hours, while maintaining the temperature at 45° C. The temperature is then increased to 60° C. A poling time of 3 hours, the field is linearly increased to 750 KV/cm at poling time of 4.8 hours, at which time the temperature is increased to 90° C. Poling is continued at 750 KV/cm field for about 30 minutes at which time the temperature is permitted to return to room temperature. When room temperature is reached, the field is reduced to zero. Retained solvent content is about 17 percent.

The polarized material shows the following properties:

| | |
|---|---|
| $d_{31}$ | 13 pC/N |
| $d_{33}$ | 32 pC/N |
| $e_{31}$ | 9.5 mc/m² |
| $P_y$ | 22.5 uC/m²k |
| dielectric constant | 31 |
| dynamic mechanical modulus | $0.6 \times 10^{10}$ dynes/cm² (at 3 Hz) |
| dp | 5 pC/N |

EXAMPLE 2

Five parts of Kynar copolymer $VF_2VF_3$ (80% $VF_2$) film produced by Pennwalt Corporation are dissolved in 95 parts of tricresylphosphate at 240° C. The solution is transferred to a tray and placed into a vacuum oven. The oven is maintained at a vacuum of about $10^{-3}$ torr and at a temperature within the range of 100° C.–120° C. until a copolymer solution is obtained having about 70 percent by weight of copolymer and 30 percent by weight of tricresylphosphate. The copolymer solution is transferred as a film to a press, subjected to a pressure of 3000 psi and heated to 125° C. The film is then rapidly cooled by immersion into an ice bath. This film having a thickness of about 1 mil is transferred to a poling apparatus of the type depicted in FIG. 1 between two polished copper plates, is connected to a high voltage DC supply, and then is placed under high vacuum ($\sim 10^{-6}$ torr). The copolymer solution film is poled generally in a manner as shown in FIG. 2 at 250 KV/cm at 45° C. for about 45 minutes, at which point the field is linearly increased to 600 KV/cm at poling time of about 4 hours while maintaining the temperature at 45° C. The temperature is then increased to 60° C. Poling is continued at 600 KV/cm field for about 15 minutes at which time the temperature is permitted to return to room temperature. When room temperature is reached, the field is reduced to zero.

The polarized material shows the following properties:

| | |
|---|---|
| $d_{31}$ | 9.66 pC/N |
| $e_{31}$ | 2.3 mc/m² |
| dynamic mechanical modulus | $0.18 \times 10^{10}$ dynes/cm² |
| Py | uC/m²k |
| dielectric constant | 12.2 |
| $d_{33}$ | 16.5 pC/N |
| dp | 2.7 pC/N |

EXAMPLE 3

One part by weight of Nylon-11 is dissolved in four parts of 2-ethyl-hexane 1,3 diol at 150° C. The solution is transferred to a tray and placed in a vacuum oven. The oven is maintained at a vacuum of about $10^{-3}$ torr and at a temperature of 50° C. until Nylon-11 solution is obtained having about 50% by weight of Nylon-11. The Nylon-11 solution is transferred as a film to a press, subjected to a pressure of 1000 psi and heated to 200° C. The film is then rapidly cooled by immersion into an ice bath. The Nylon-11 solution film now comprises 70% by weight of Nylon-11 and 30% by weight of 2-ethyl-hexane 1,3 diol. This film having a thickness of about 1 mil is transferred to a poling apparatus of the type depicted in FIG. 1 between two polished copper plates, is connected to a high voltage DC supply, and then is placed under high vacuum ($\sim 10^{-6}$ torr) The Nylon-11 solution film is poled generally in a manner as shown in FIG. 2. The field is increased linearly from zero to 350 KV/cm in ten minutes, while maintaining the temperature at 22° C. Poling at this field strength is continued for a further ten minutes at which time the field is reduced to zero.

EXAMPLE 4

One part by weight of Nylon-7 is dissolved in four parts of 2-ethyl-hexane 1,3 diol at 170° C. The solution is transferred to a tray and placed into a vacuum oven.

The oven is maintained at a vacuum of about $10^{-3}$ torr and at a temperature of 50° C. until Nylon-7 solution is obtained having about 50% by weight of Nylon-7. The Nylon-7 solution is transferred as a film to a press, subjected to a pressure of 1000 psi and heated to 220° C. The film is then rapidly cooled by immersion into an ice bath. The Nylon-7 solution film now comprises 73% by weight of Nylon-7 and 27% by weight of 2-ethyl-hexane 1,3 diol. This film having a thickness of about 1 mil is transferred to a poling apparatus of the type depicted in FIG. 1 between two polished copper plates, is connected to a high voltage DC supply, and then is placed under high vacuum ($\sim 10^{-6}$ torr). The Nylon-7 solution film is poled generally in a manner as shown in FIG. 2. The field is increased linearly from zero to 350 KV/cm in ten minutes, while maintaining the temperature at 22° C. Poling at this field strength is continued for a further ten minutes at which time the field is reduced to zero.

EXAMPLE 5

Five parts of Kureha capacitor grade poly(vinylidene fluoride) ($PVF_2$) film are dissolved in 95 parts of tricresylphosphate at 185° C. The solution is transferred to a tray and placed into a vacuum oven. The oven is maintained at a vacuum of about $10^{-3}$ torr and at a temperature within the range of 150° C.-200° C. until a $PVF_2$ solution is obtained having about 70 percent by weight of $PVF_2$ and 30 percent by weight of tricresylphosphate. The $PVF_2$ solution is transferred as a film to a press, subjected to a pressure of 3000 psi and heated to 185° C. The film is then rapidly cooled by immersion into an ice bath. The cooled film has some crystallinity, approximately 12-13 percent. The $PVF_2$ and 23.5 percent by weight of tricresylphosphate. This film having a thickness of about 1 mil is transferred to a poling apparatus of the type depicted in FIG. 1 between two polished copper plates, is connected to a high voltage DC supply. The $PVF_2$ solution film is heated to 160° C. The solution is poled as shown in FIG. 2 heated for about 60 minutes. During the poling, the temperature is decreased linearly at 2° C./min to 30° C. and the poling field is increased linearly from 25 KV/cm to 1000 KV/cm. When room temperature is reached, the field is reduced to zero. Retained solvent content is about 23.5 percent. The resulting product is polarized.

EXAMPLE 6

The process of Example 5 is repeated except that the solution of $PVF_2$ at 160° C. is quenched below the Tg temperature to inhibit crystallization. The quenched solution is poled using 1000 KV/cm while the temperature is increased linearly 1° C./min to room temperature at which point the poling field is reduced to zero. The retained solvent content is about 23.5 percent. The resulting product is polarized.

The polarized product produced can be further processed by applying a poling field under vacuum following the general procedure of Example 1.

EXAMPLE 7

Other materials such as other polymers and soluble ceramic materials described above can be used to provide polarized materials of this invention by following generally the procedures of Example 1 or 5 with any modifications within the skill of the art.

EXAMPLE 8

The procedure of Example 4 is repeated using instead of Nylon-7, a blend comprising 50 percent by weight of Nylon-7 and 50 percent by weight of Nylon-11. The product obtained is polarized.

EXAMPLE 9

Figure 5:
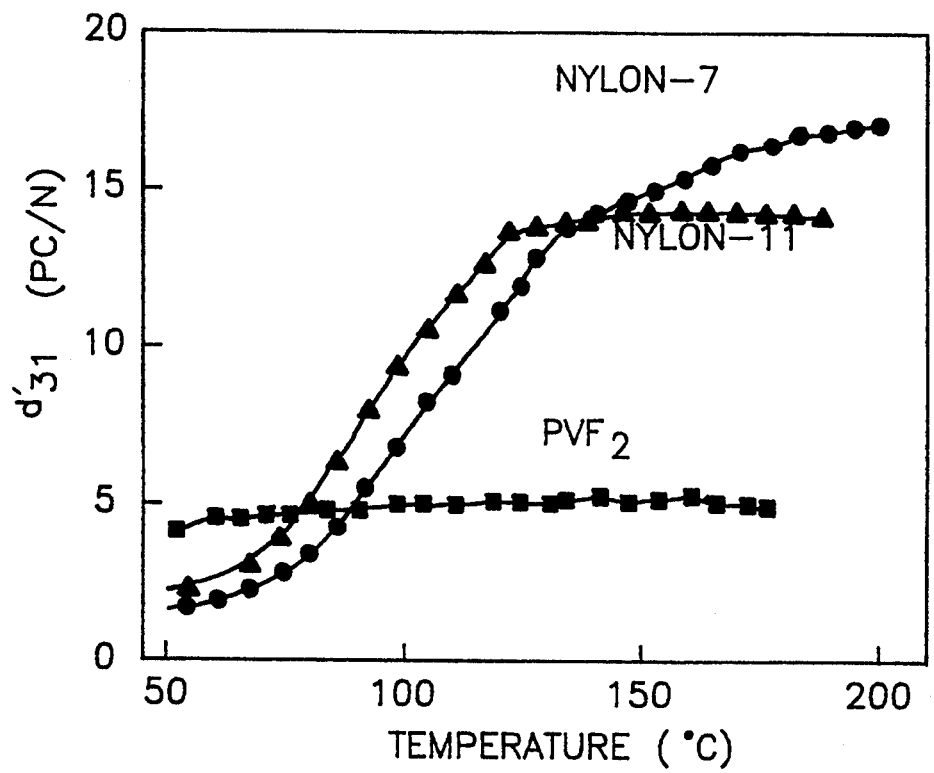
FIG. 5 is a graph of piezoelectric strain constant vs. temperature for polarized and annealed Nylon-11, Nylon-7 and $PVF_2$.
Figure 6:
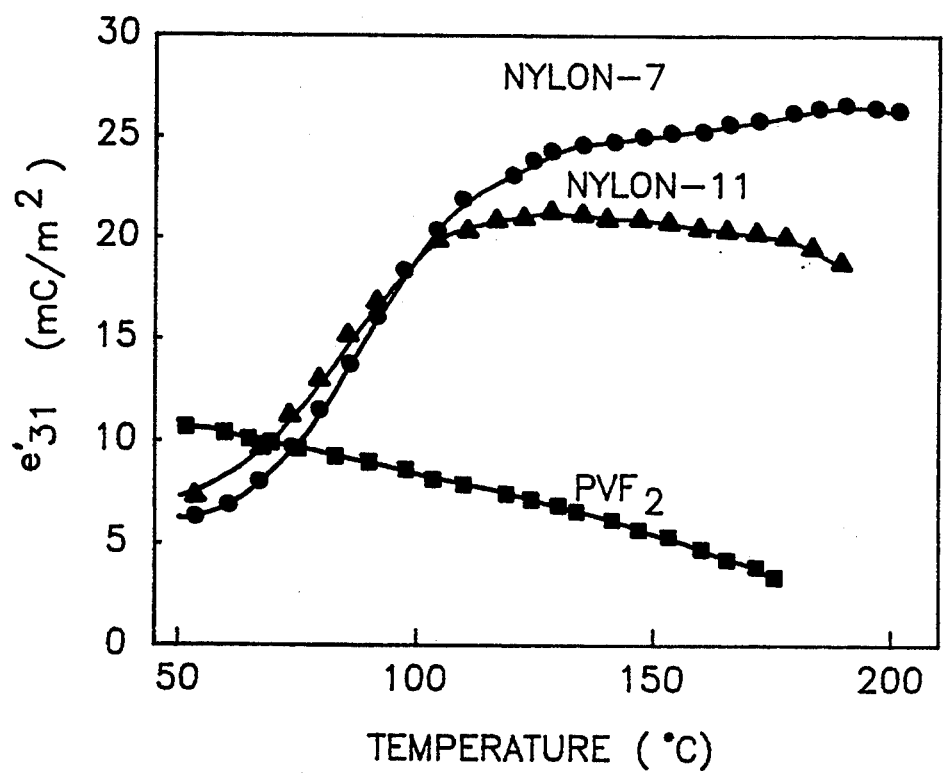
FIG. 6 is a graph of piezoelectric stress constant vs. temperature for polarized and annealed Nylon-11, Nylon-7 and $PVF_2$.
Figure 7:
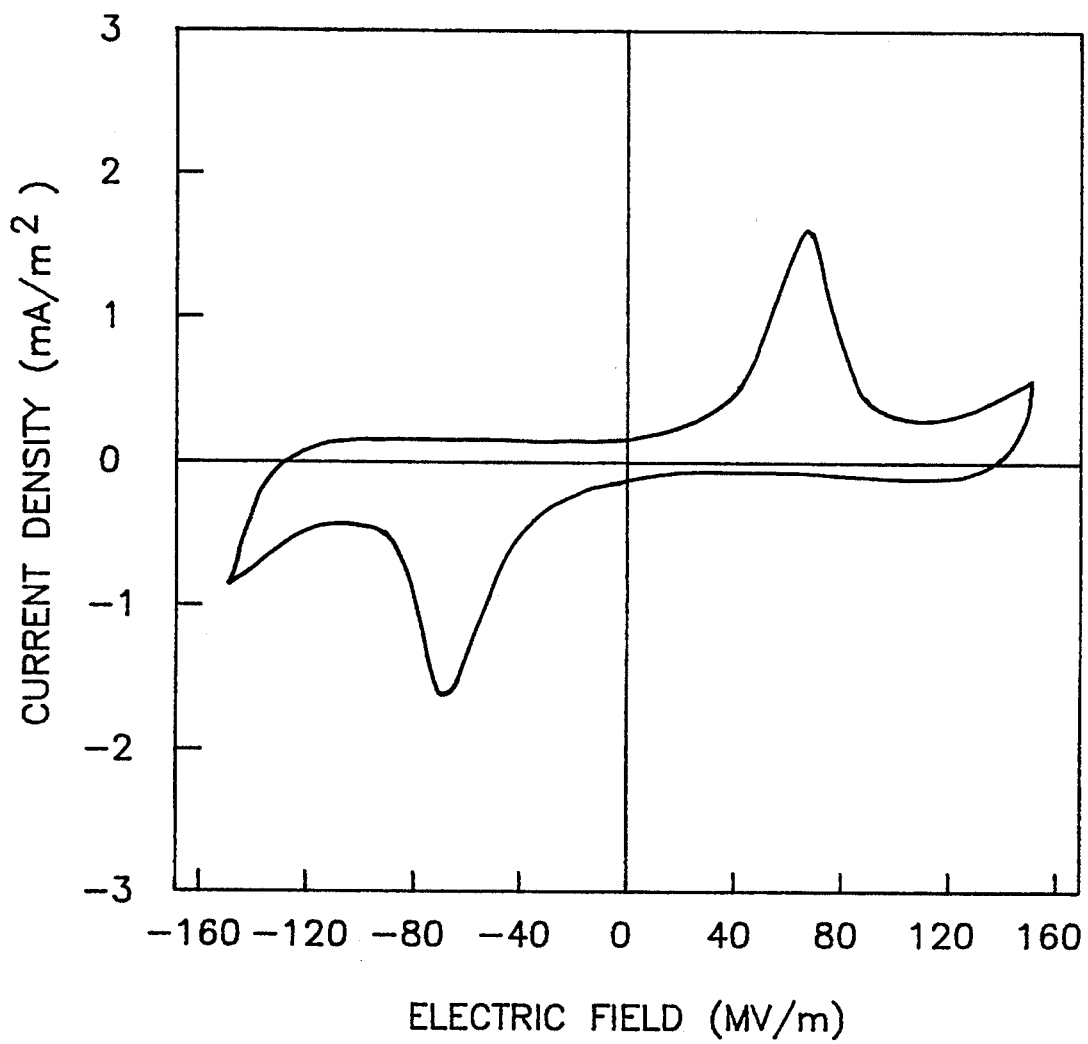
FIGS. 7–12 show the temperature dependence of piezoelectric strain constant, piezoelectric stress constant, dielectric constant and mechanical modulus for the material of example 10.
Figure 8:
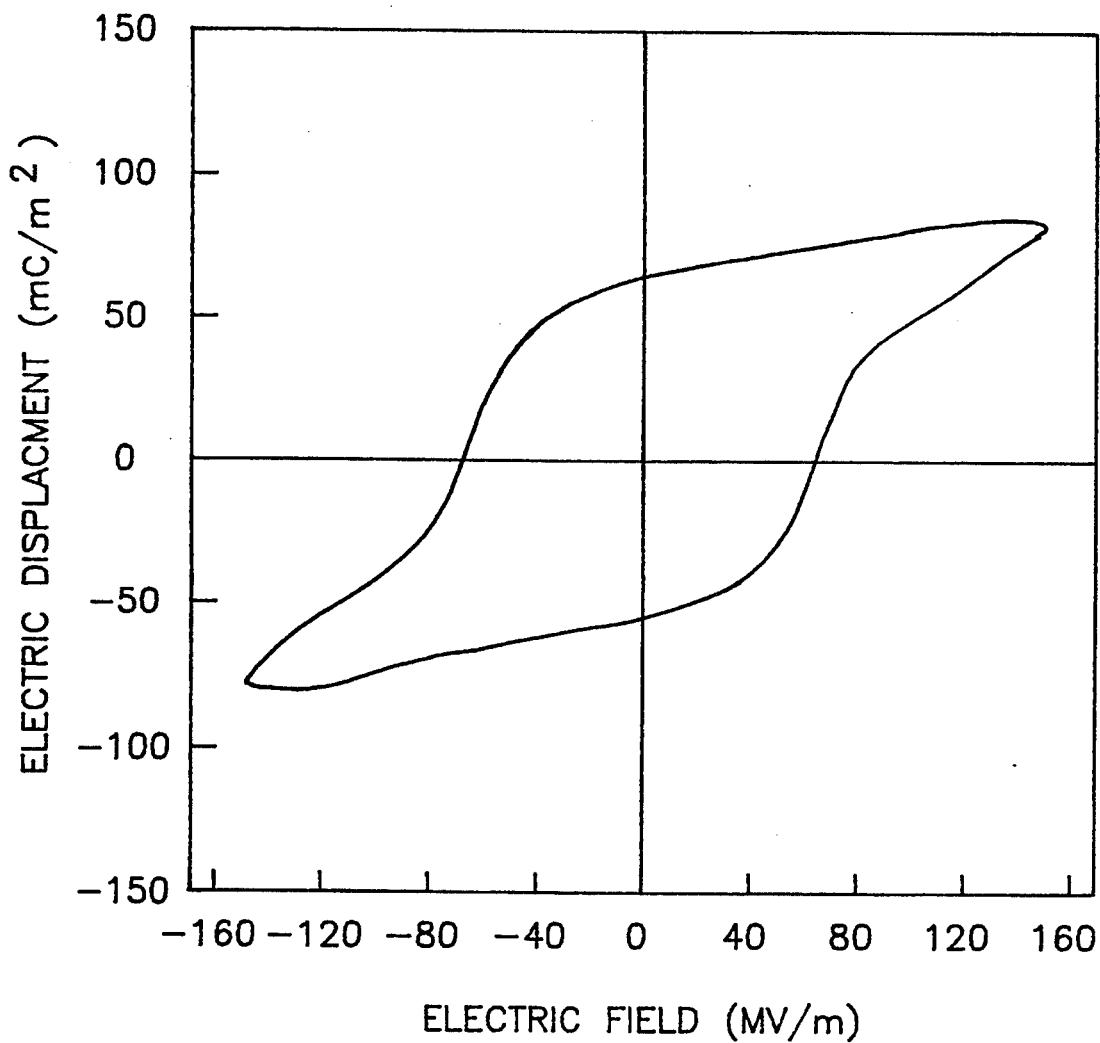
Figure 9:
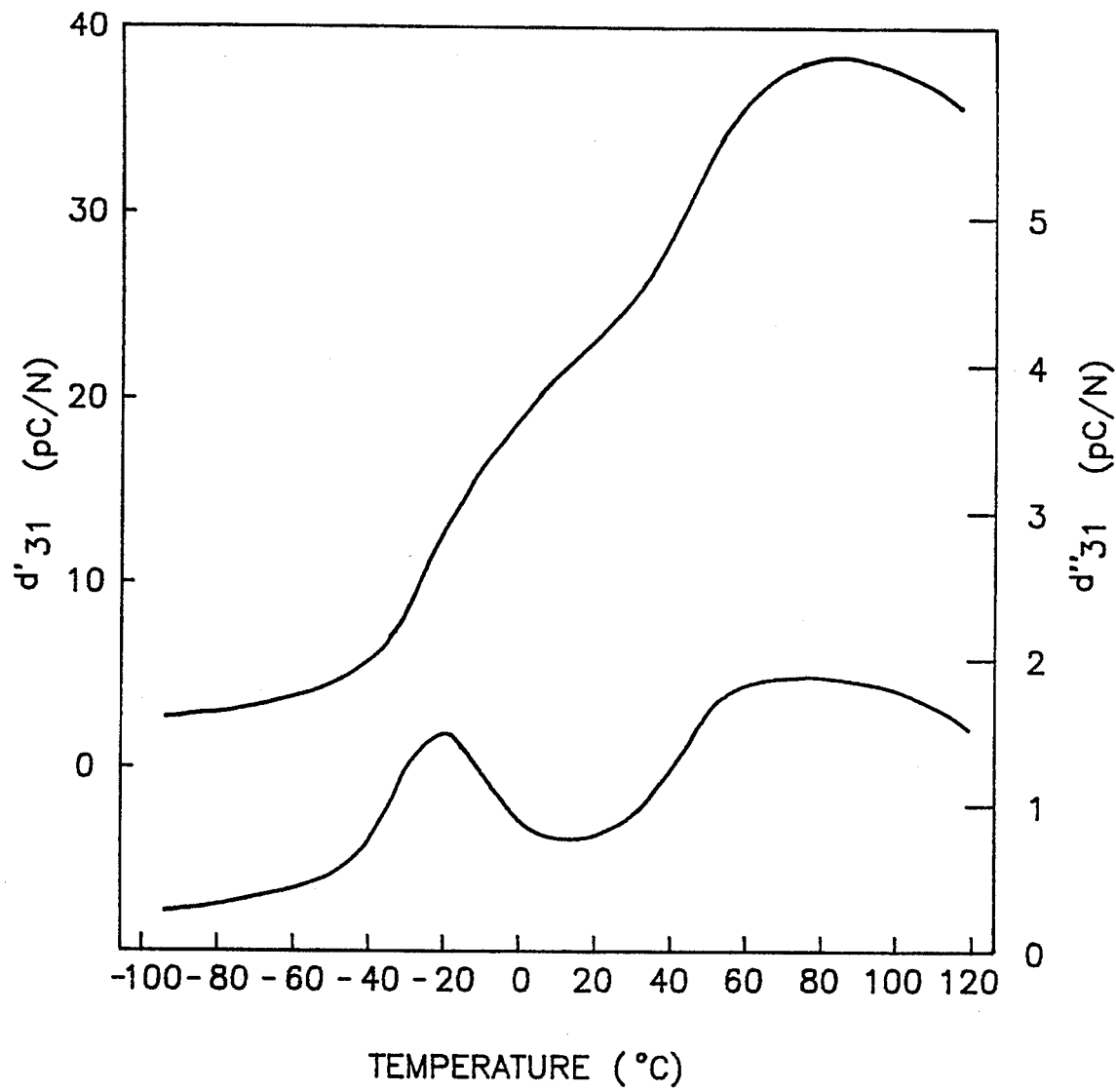
Figure 10:
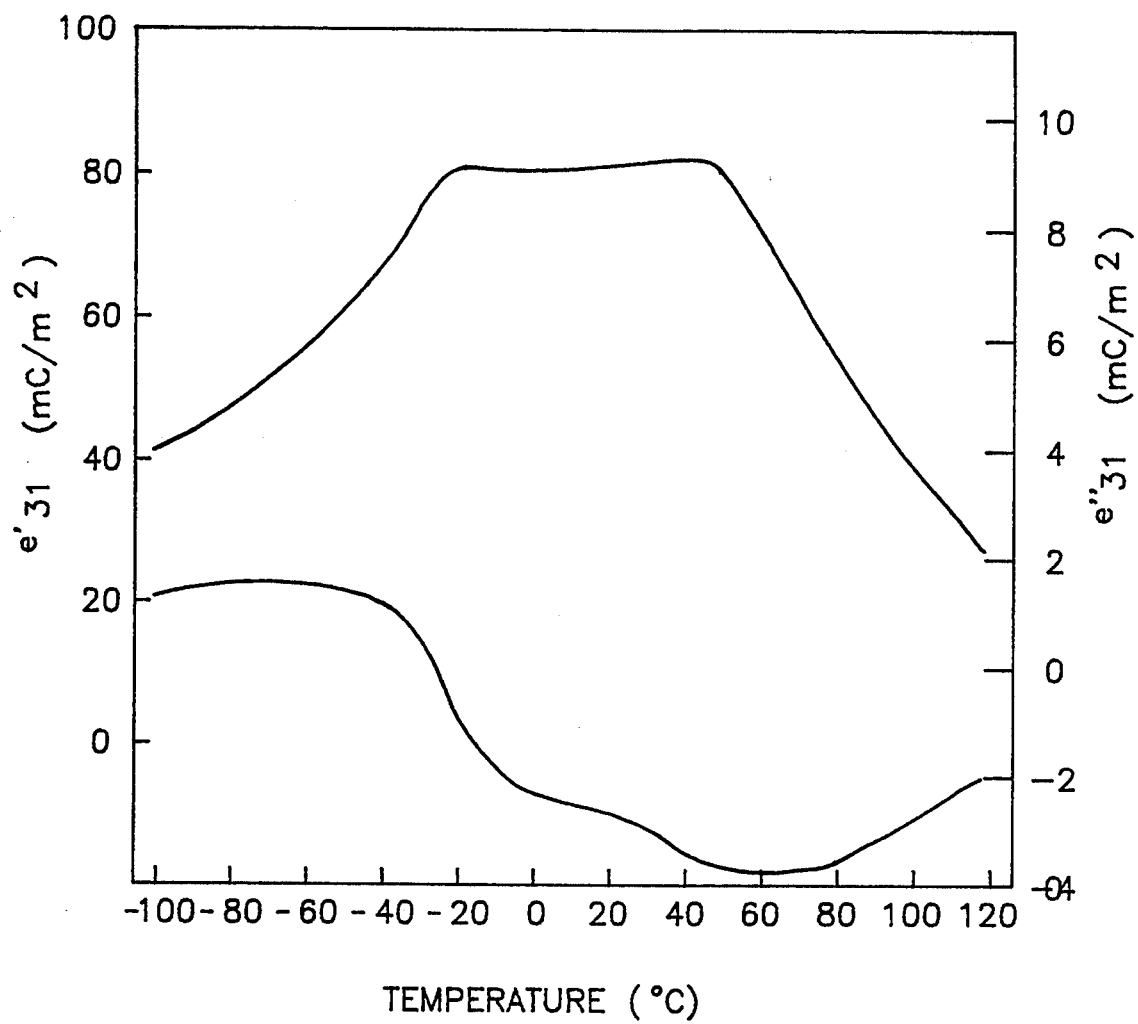
Figure 11:
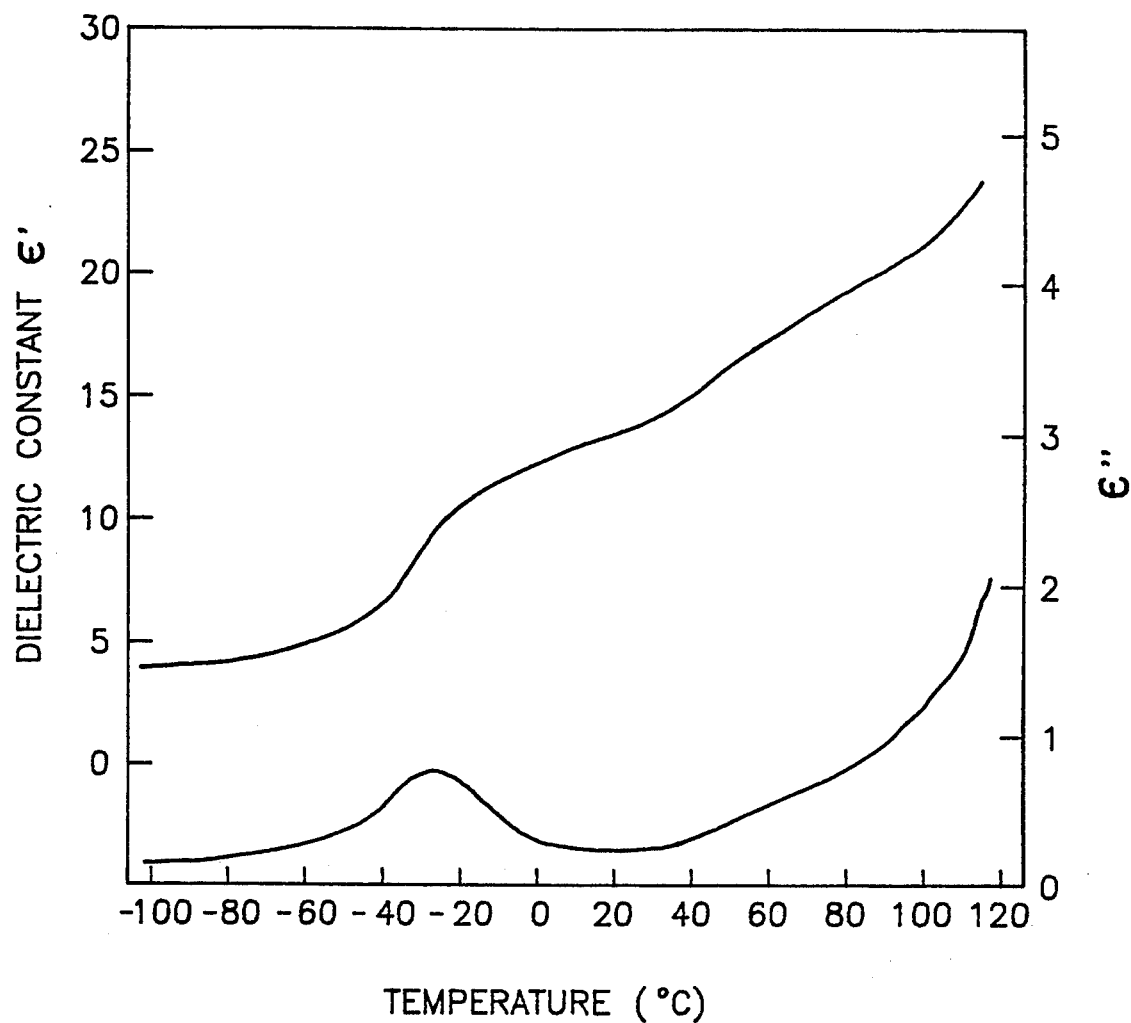
Figure 12:
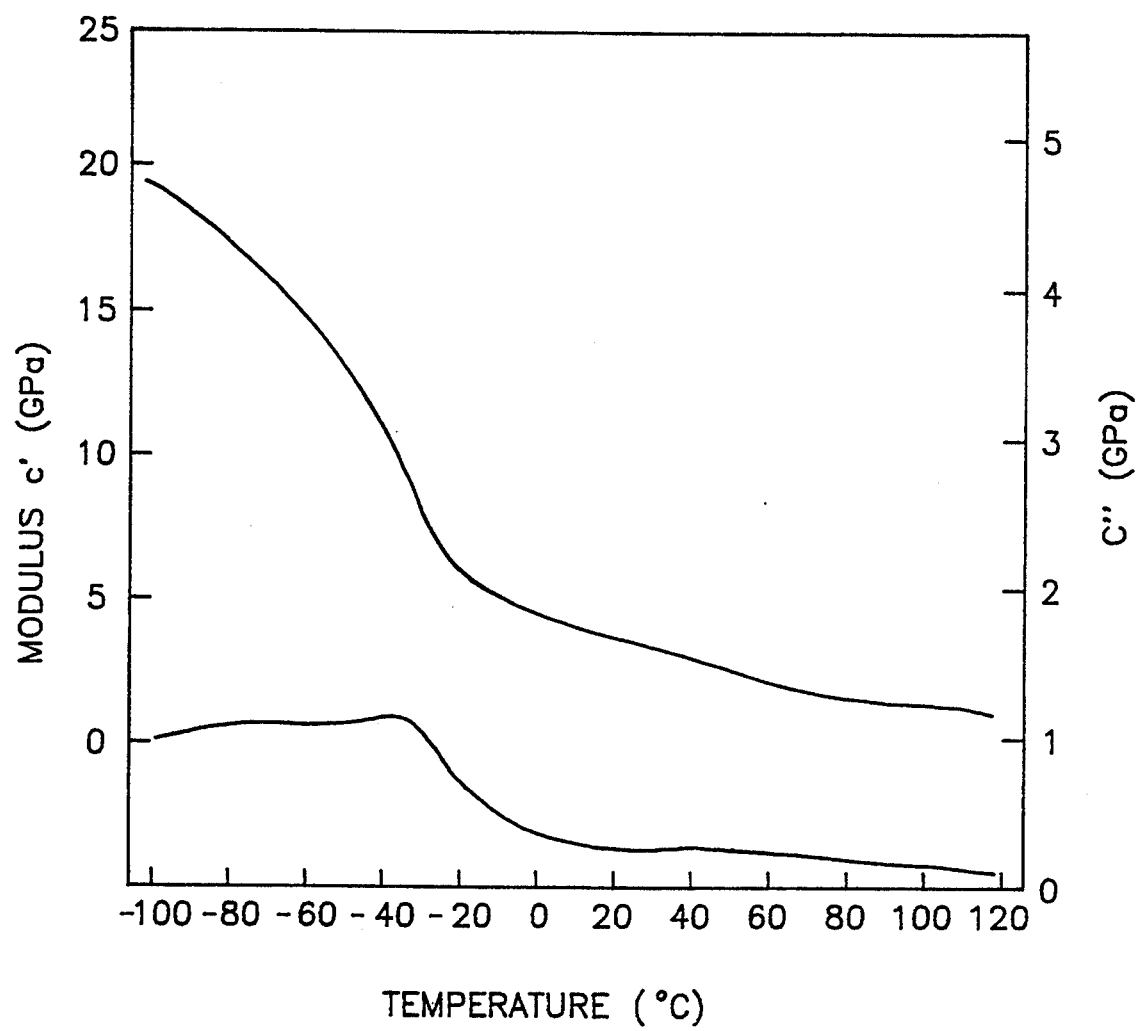
Figure 13:
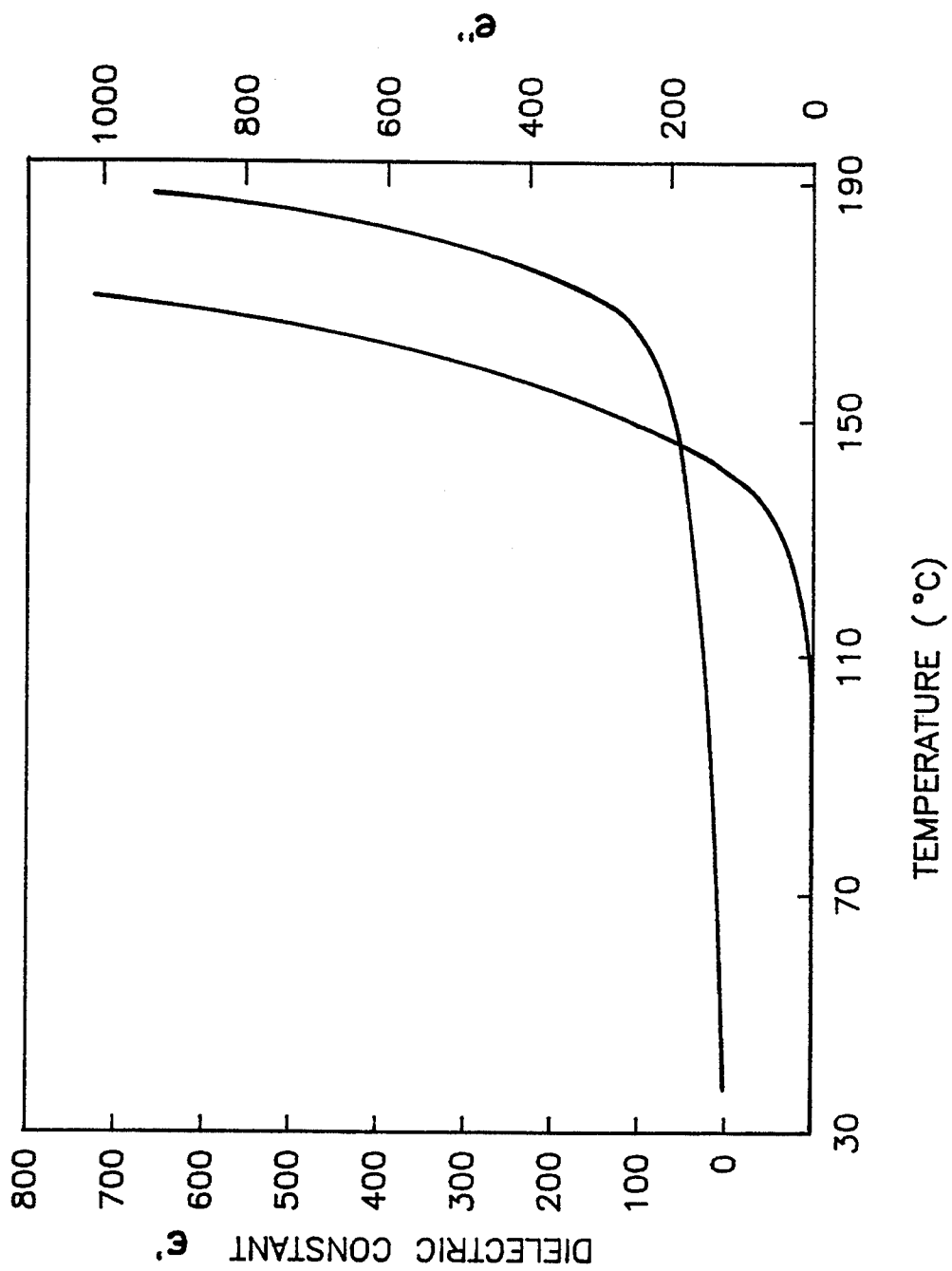
FIGS. 13–18 show relevant data for the material of example 11.
Figure 14:
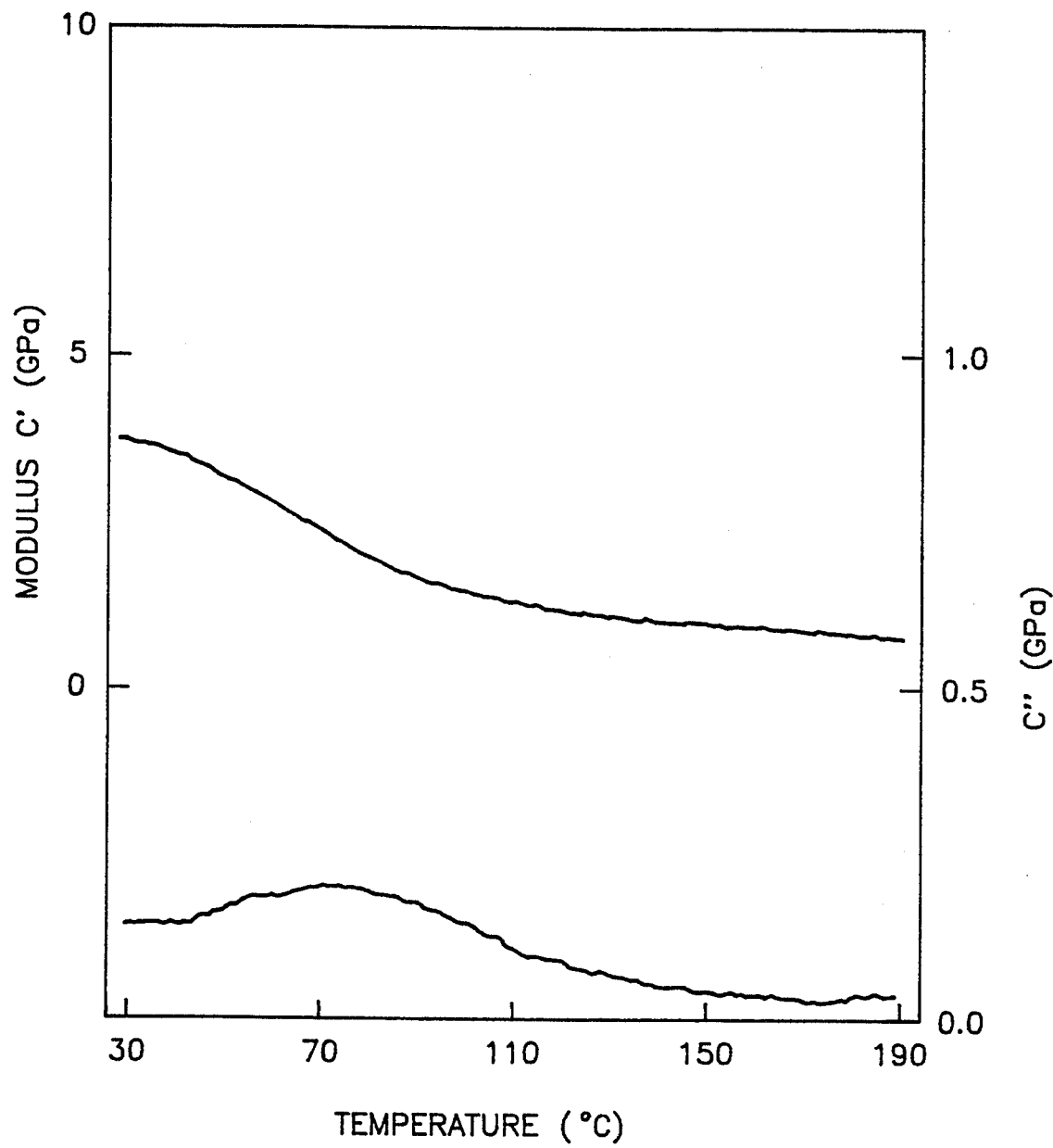
Figure 15:
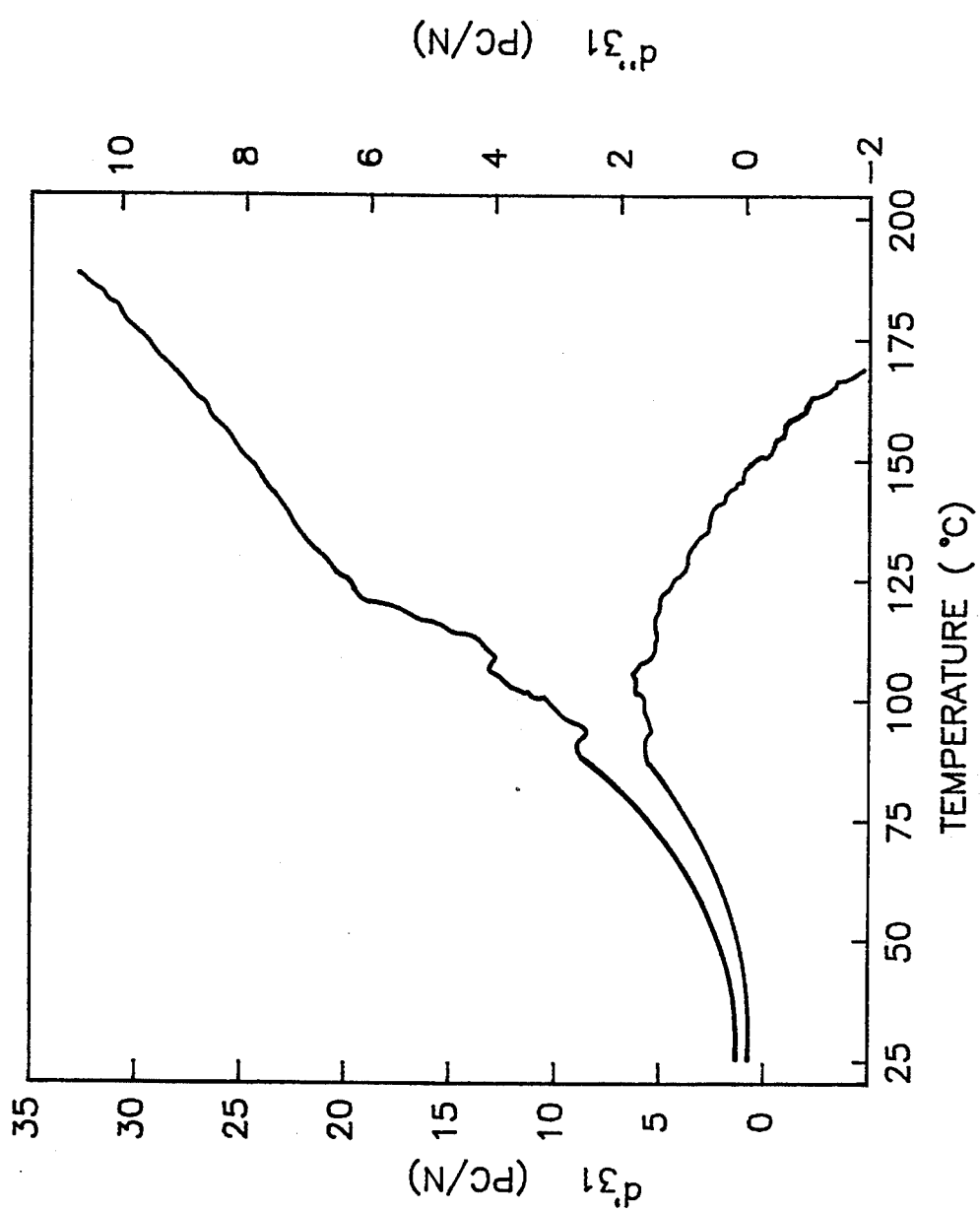
Figure 16:
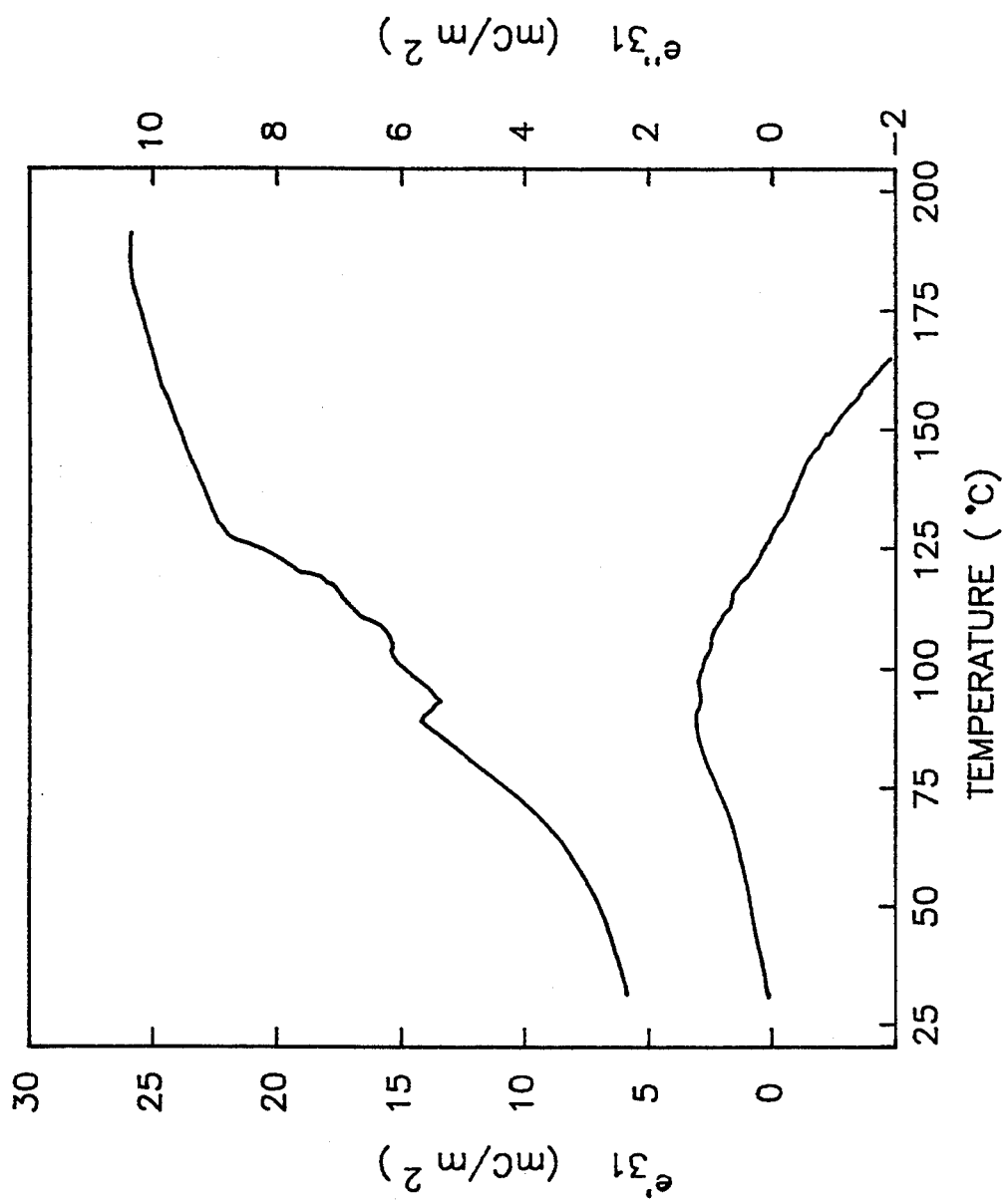
Figure 17:
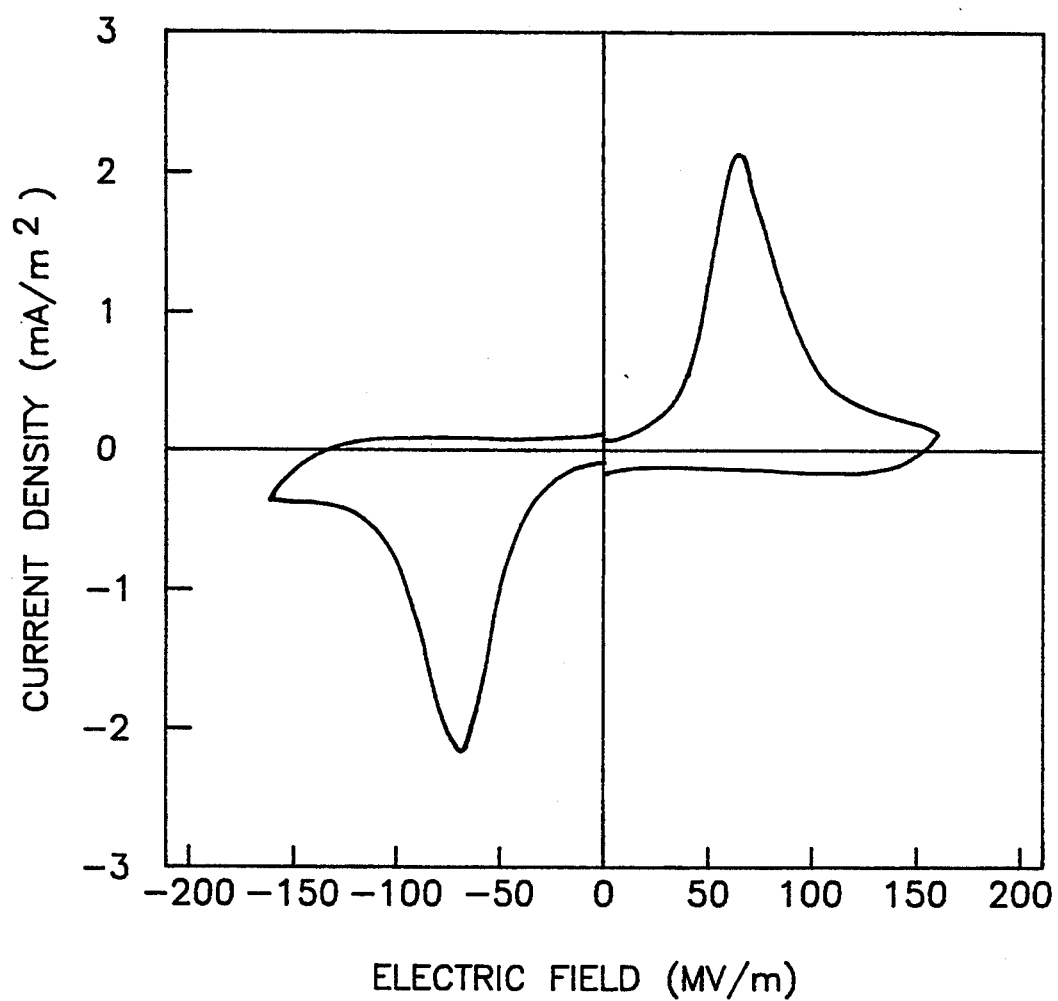
Figure 18:
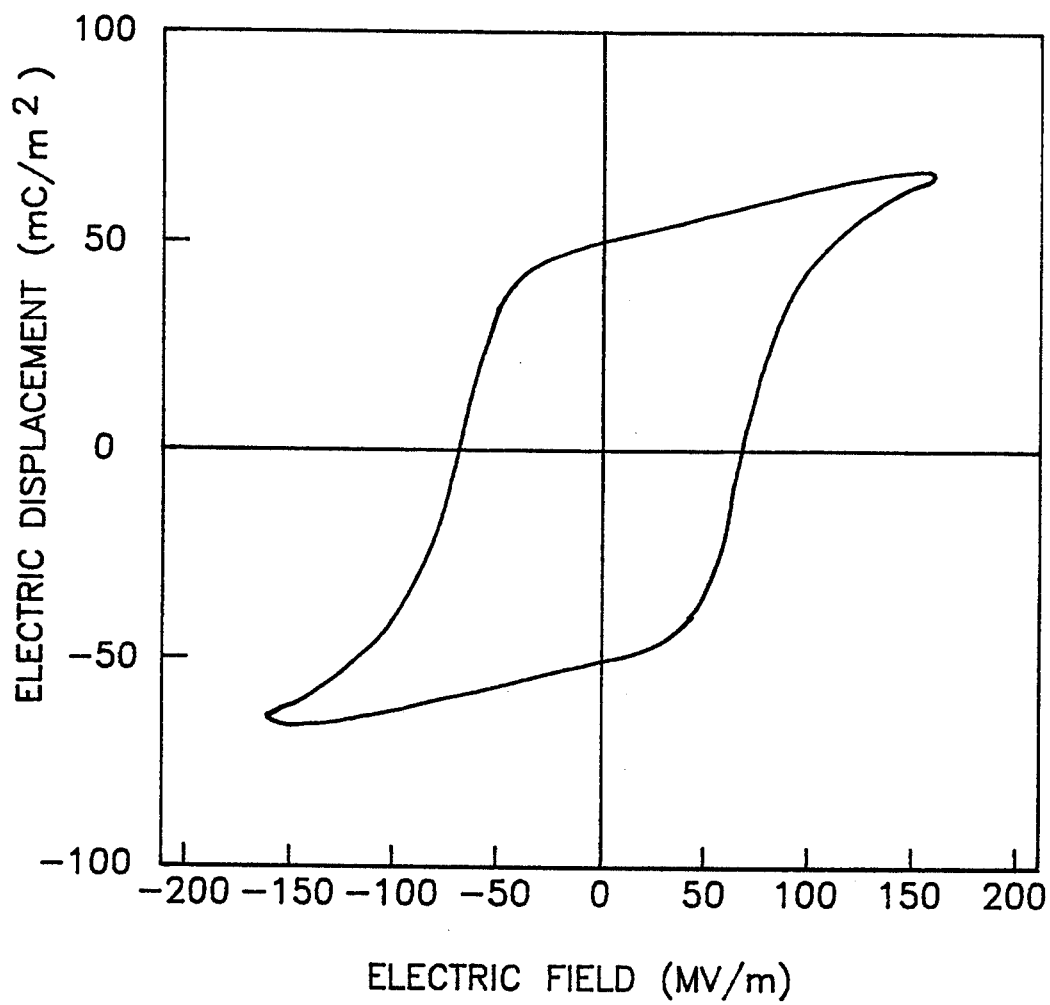
Figure 19:
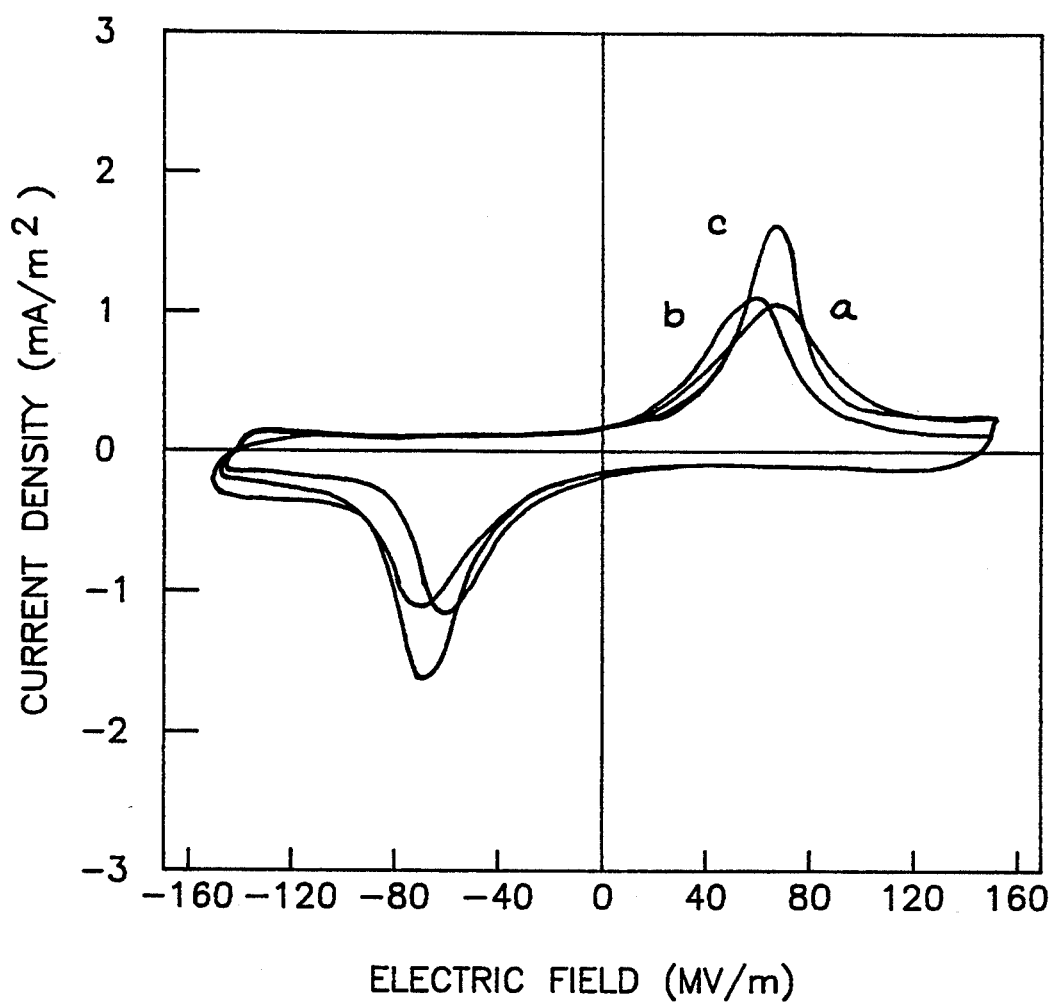
FIGS. 19–32 show relevant data for the material of example 12.
Figure 20:
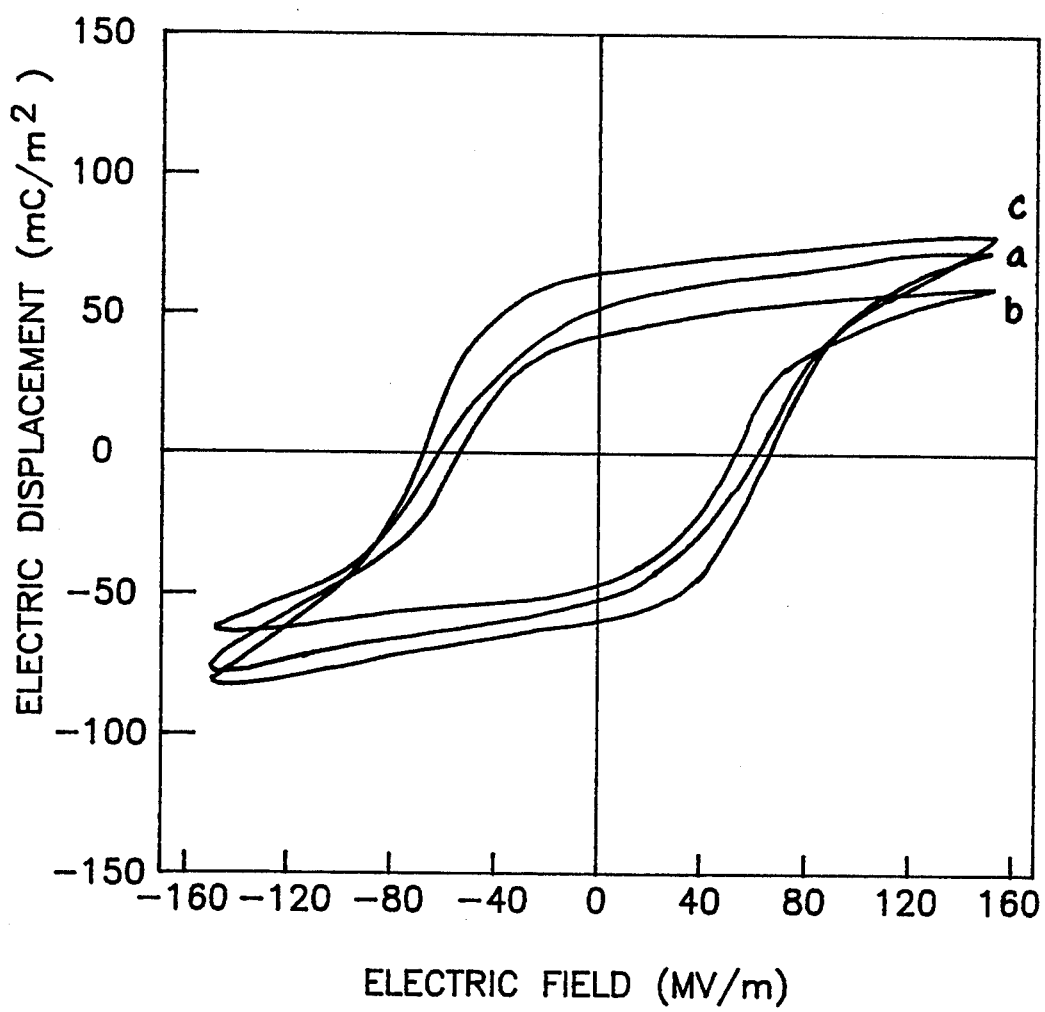
Figure 21:
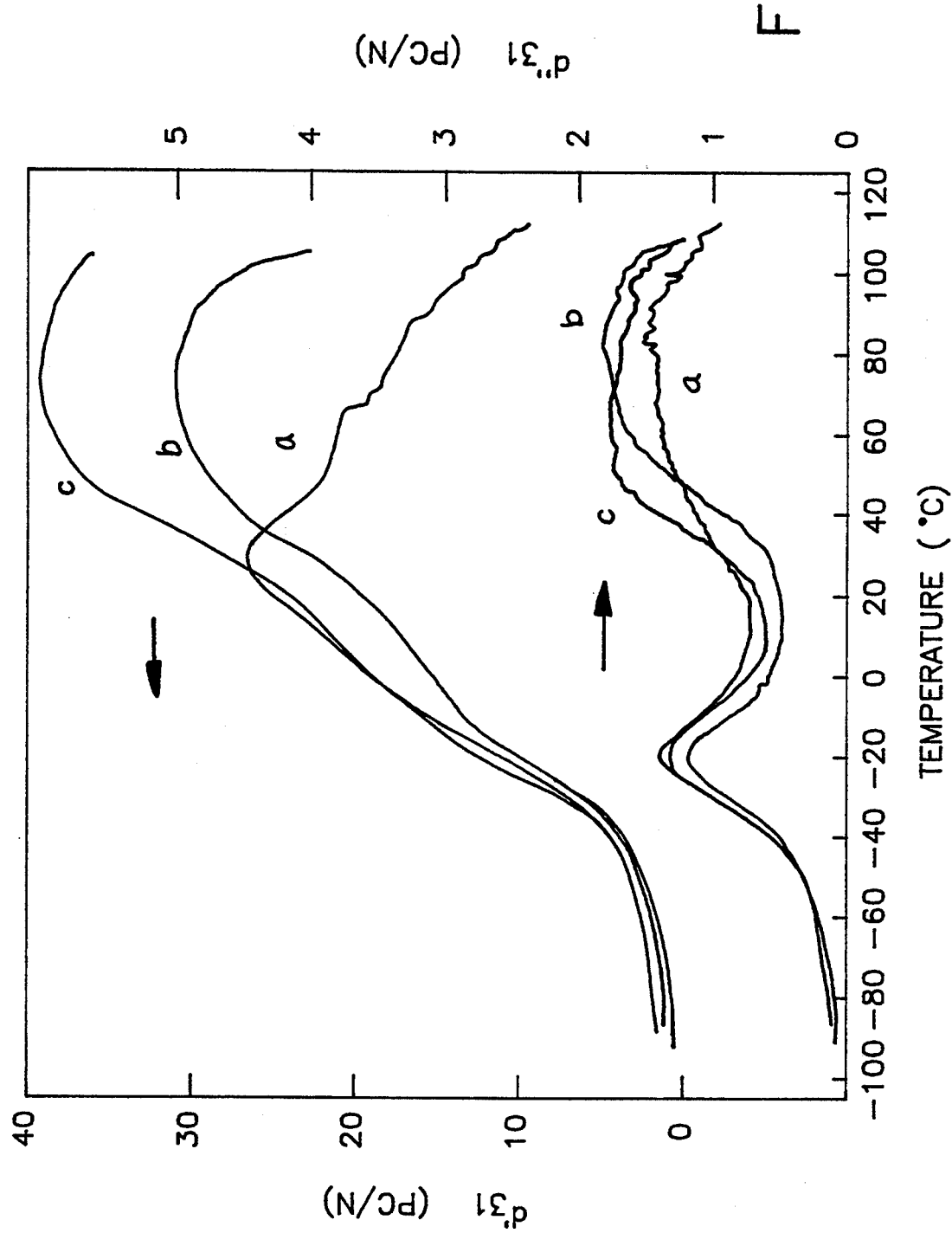
Figure 22:
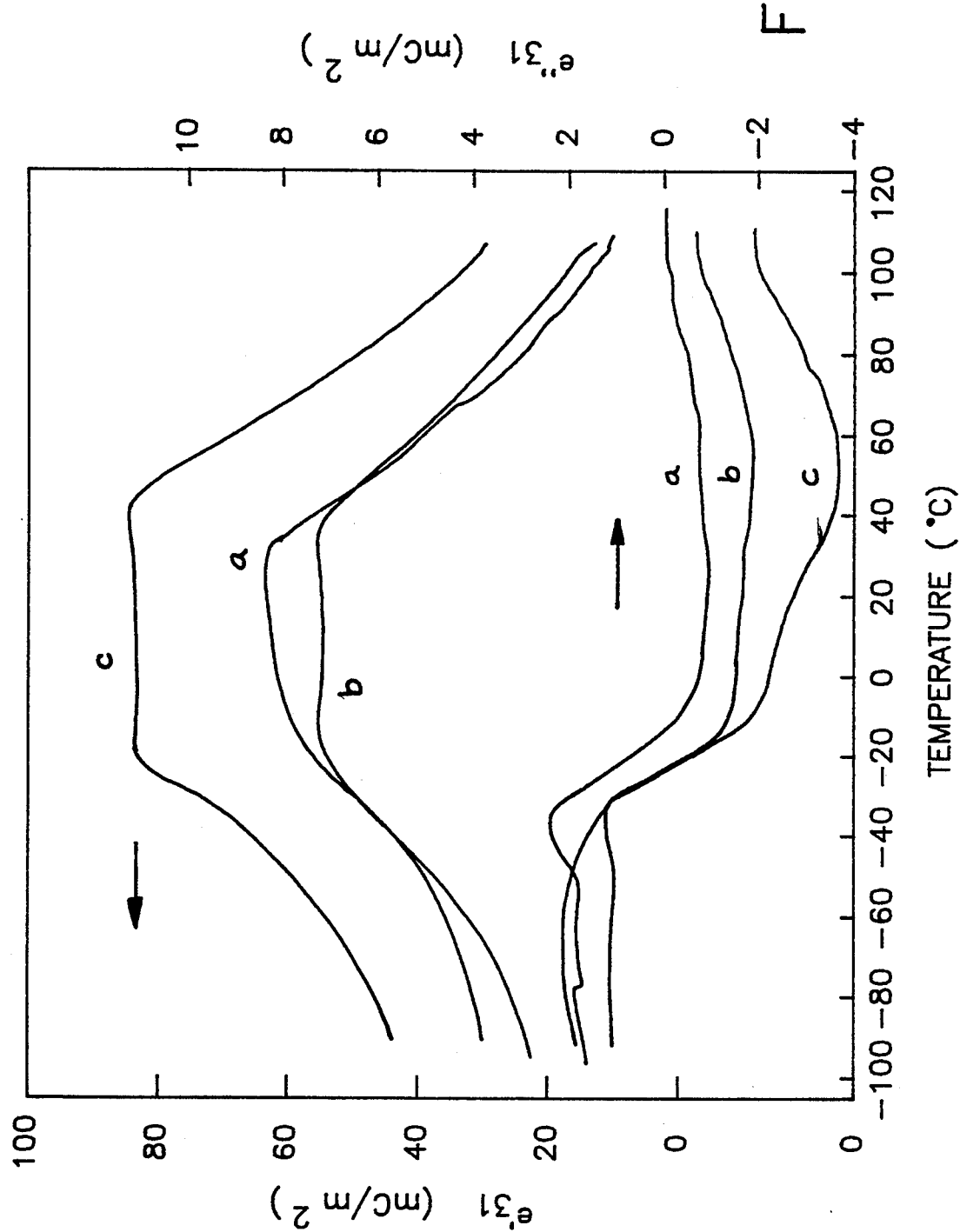
Figure 23:
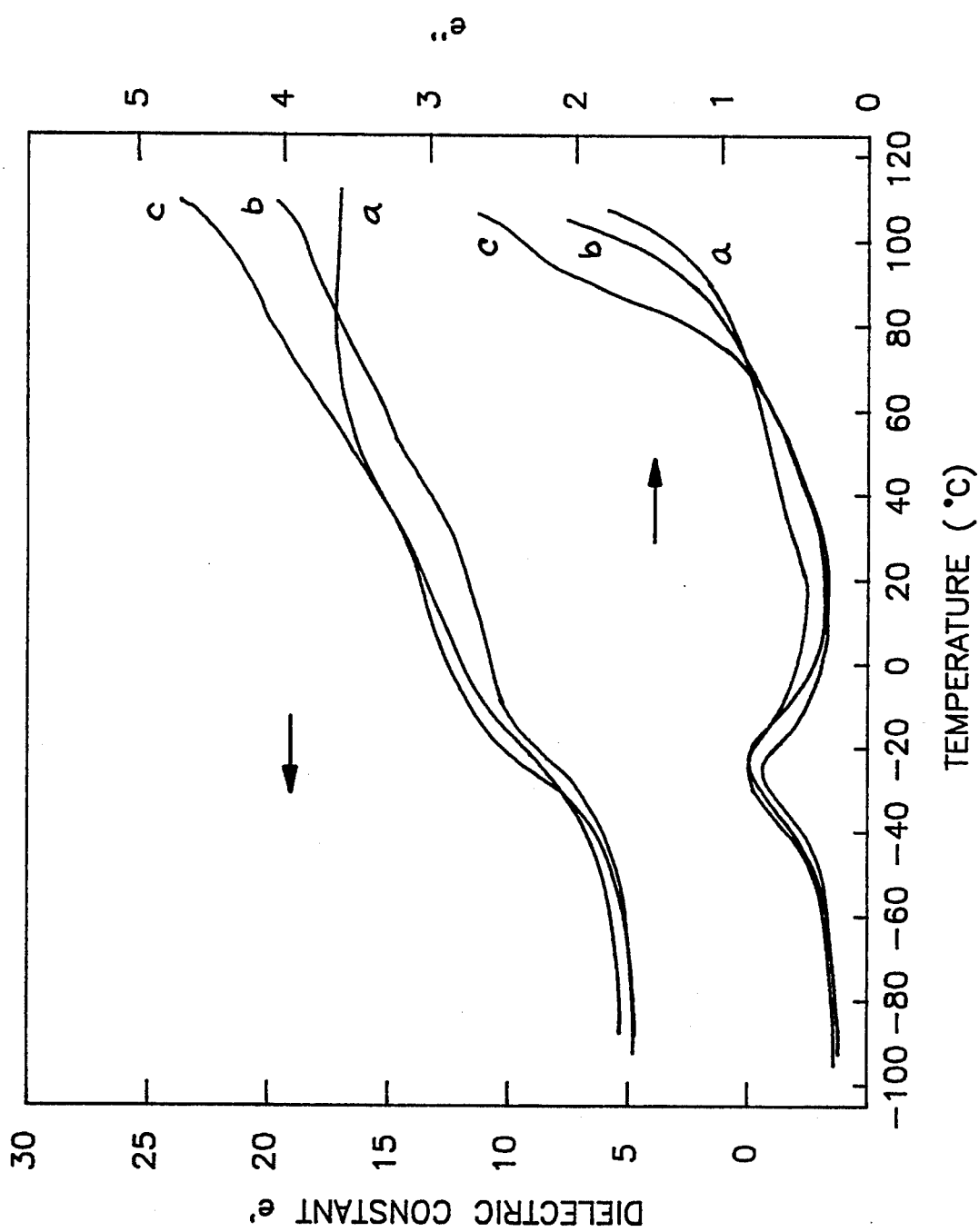
Figure 24:
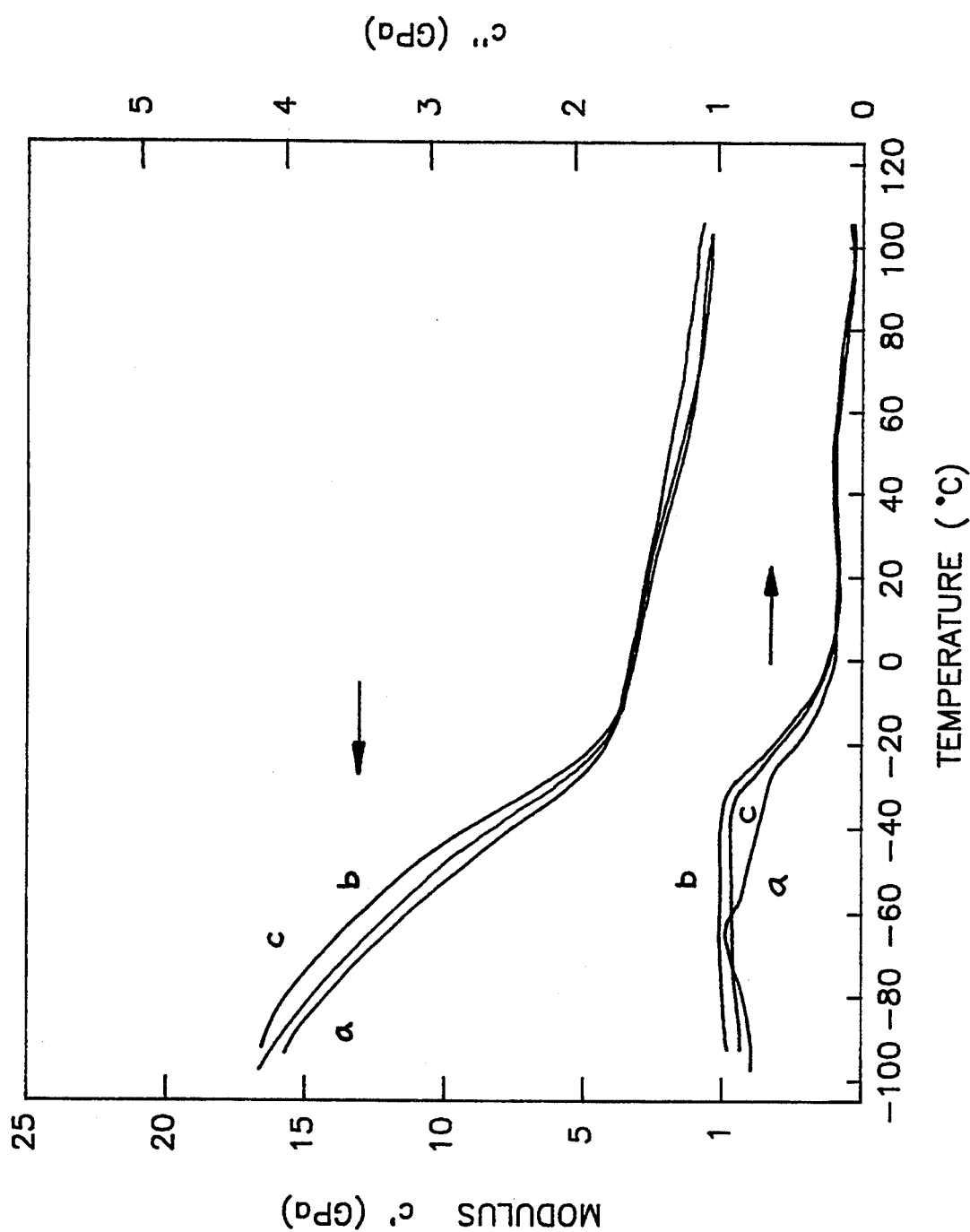
Figure 25:
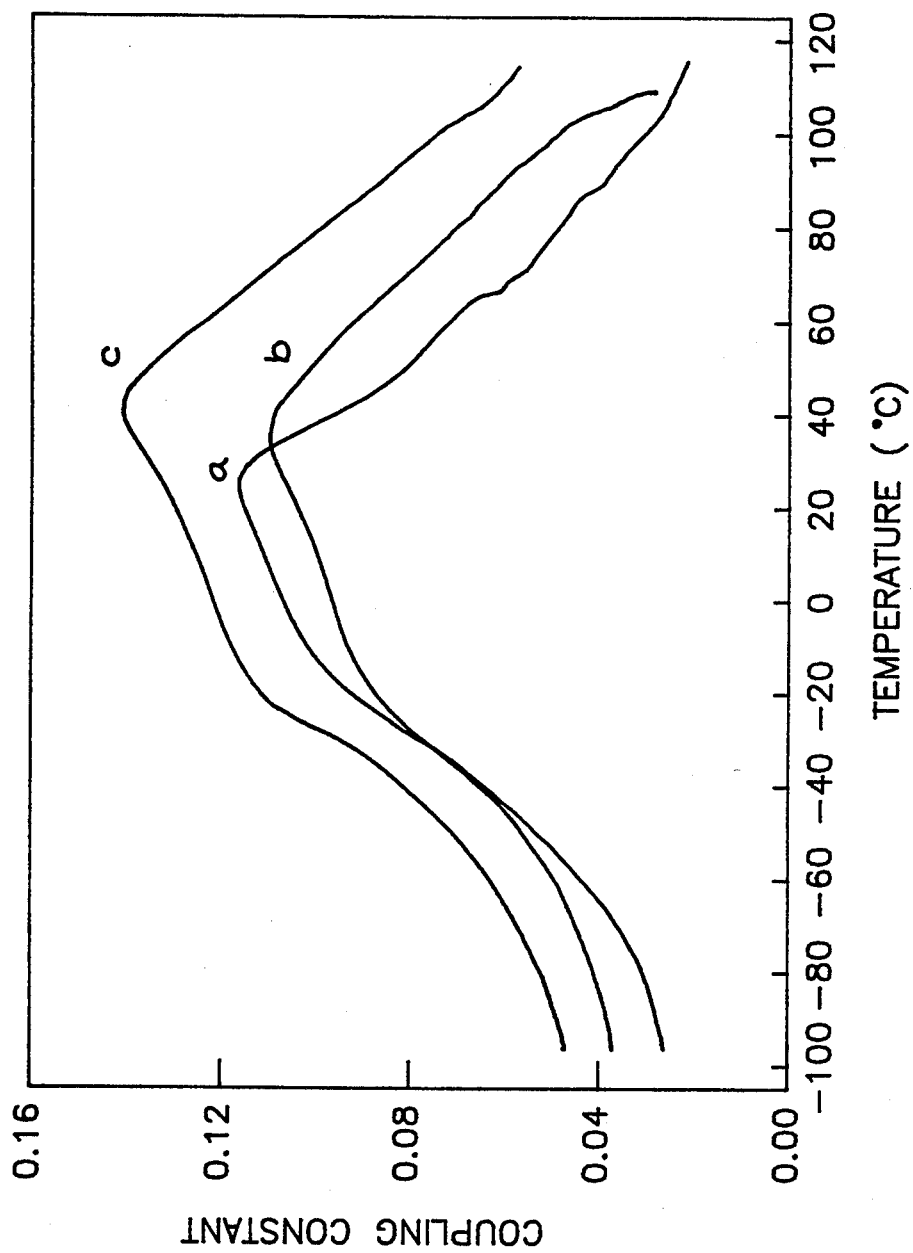
Figure 26:
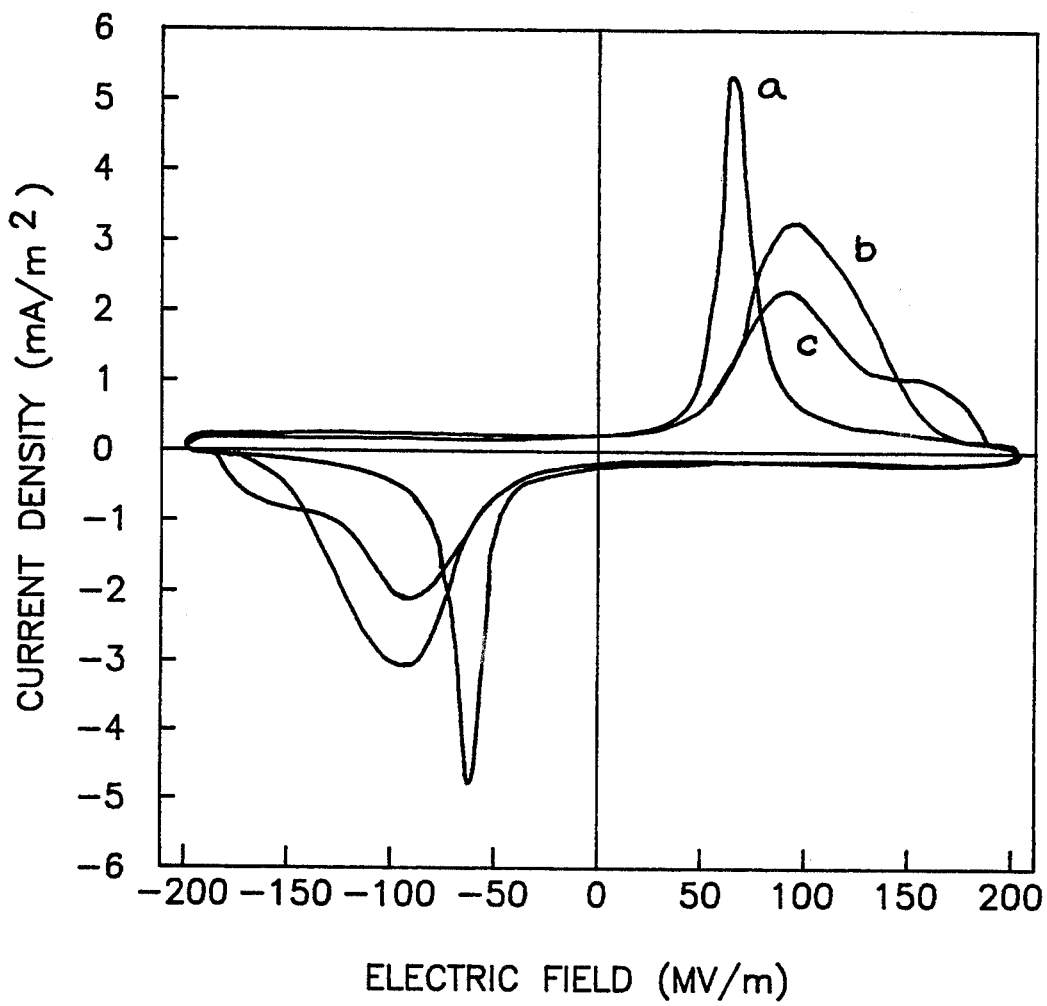
Figure 27:
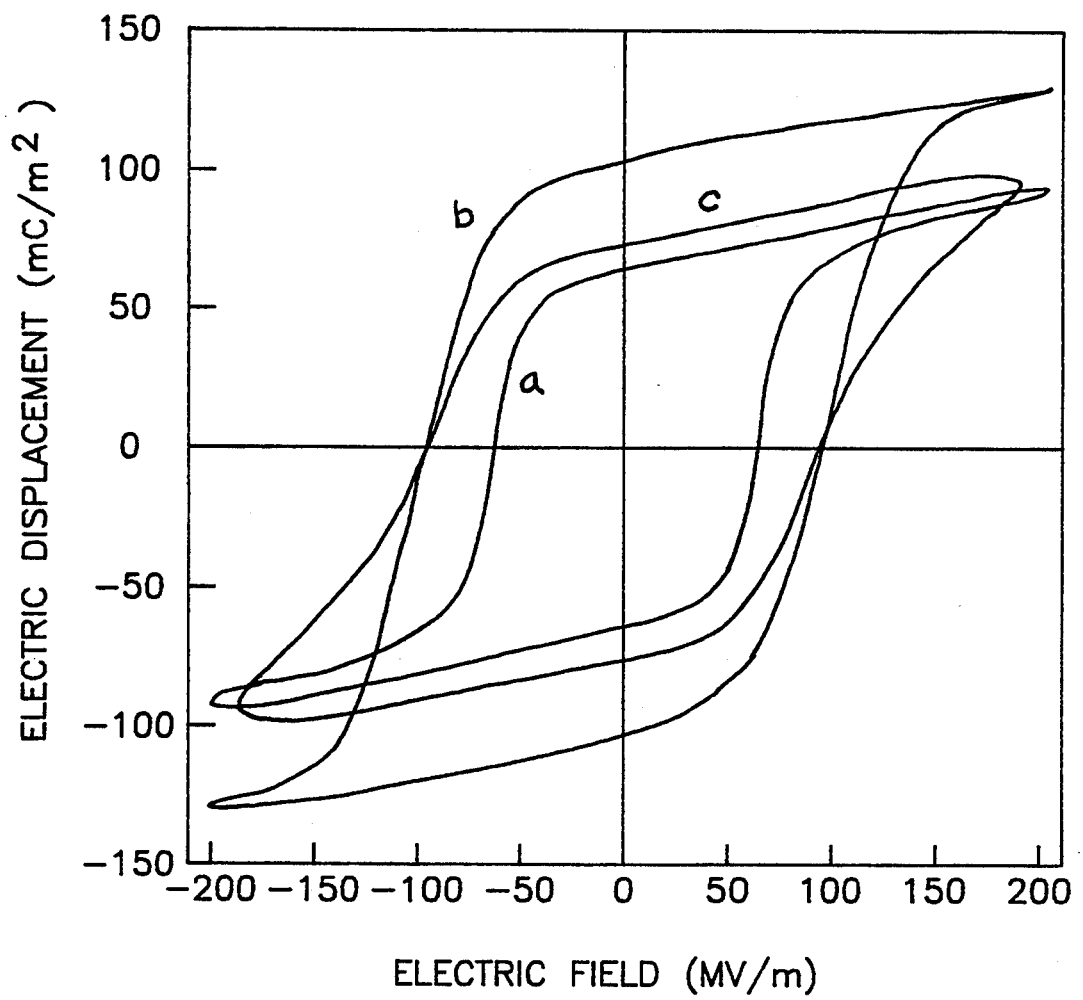
Figure 28:
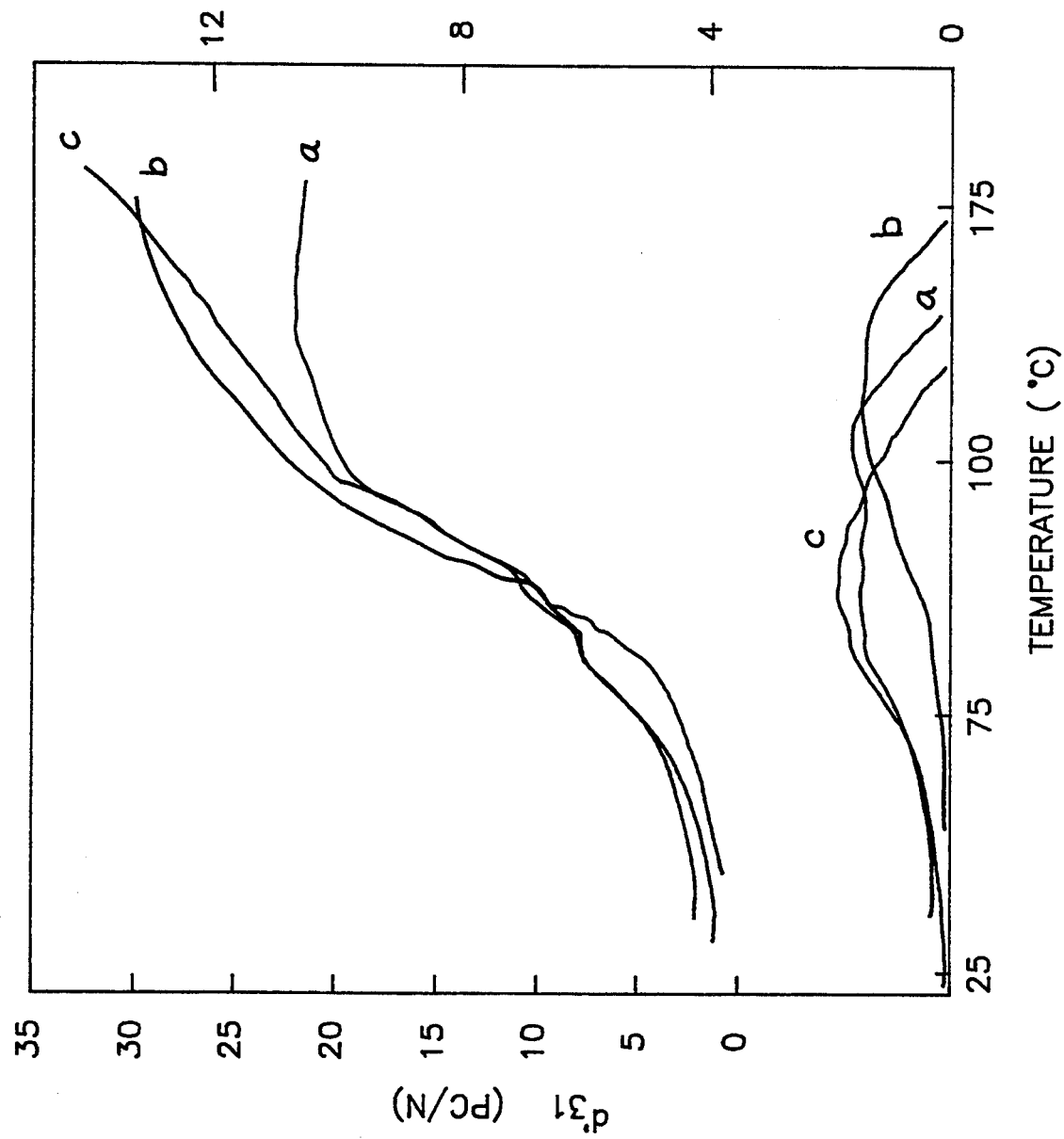
Figure 29:
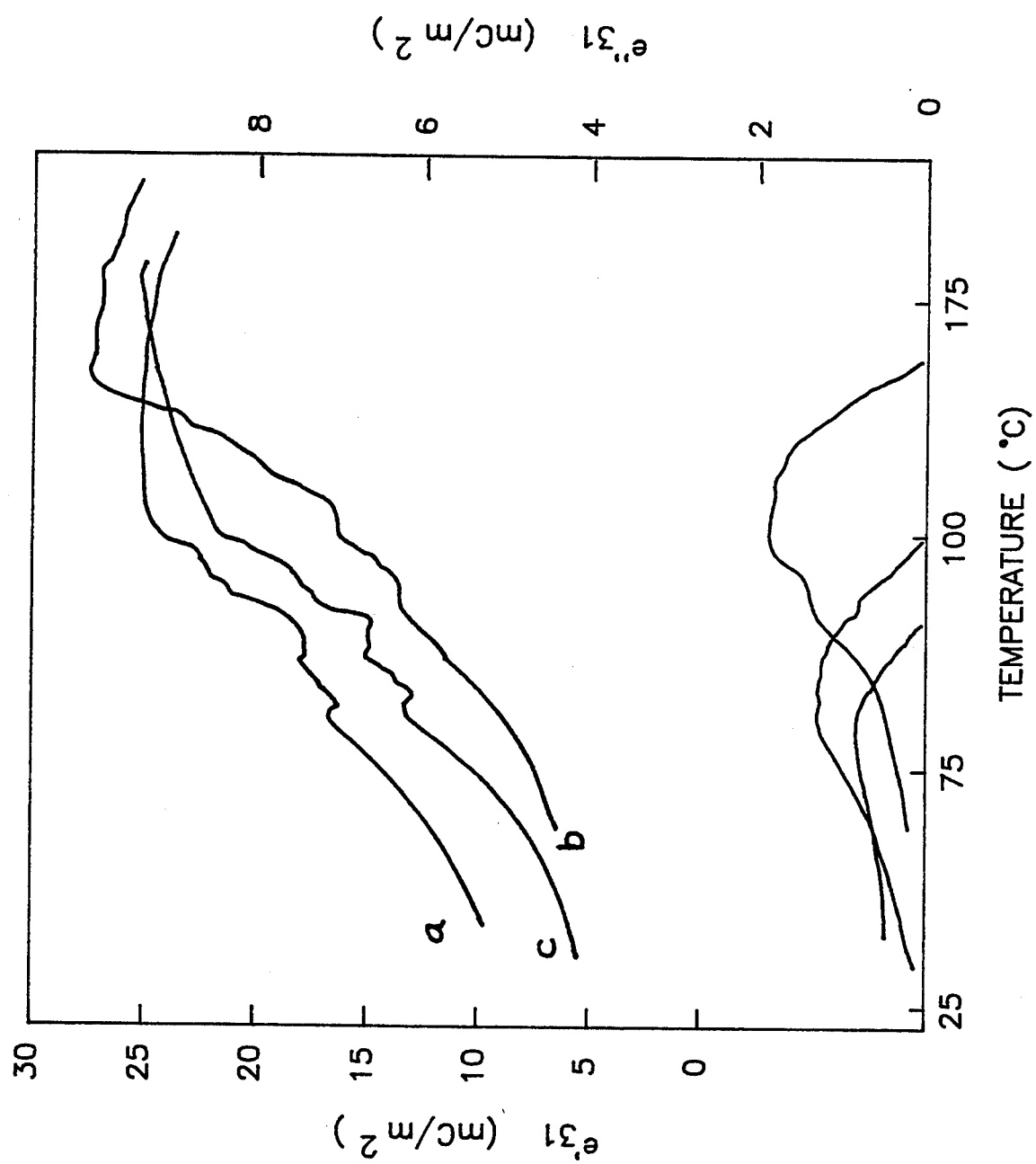
Figure 30:
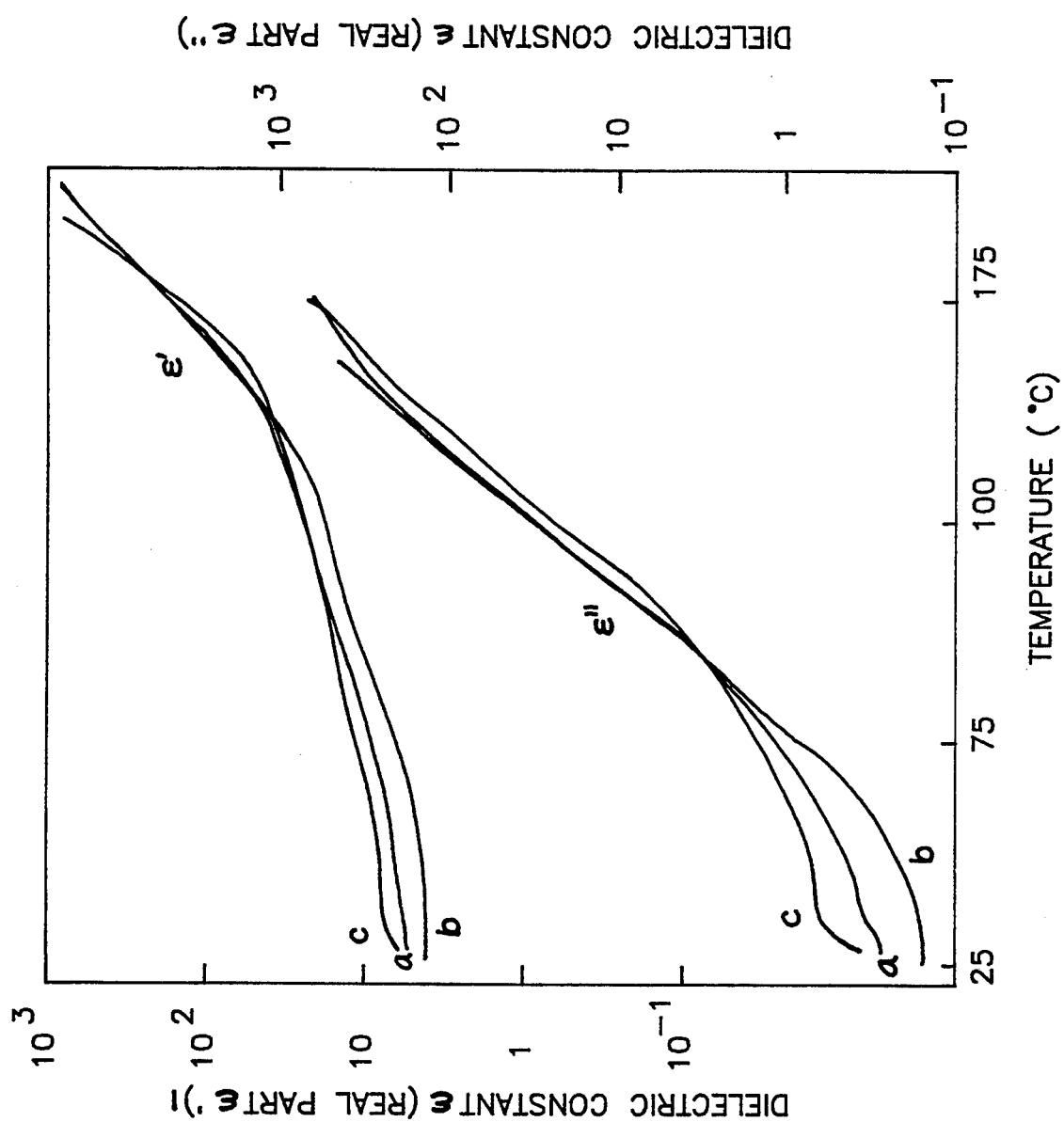
Figure 31:
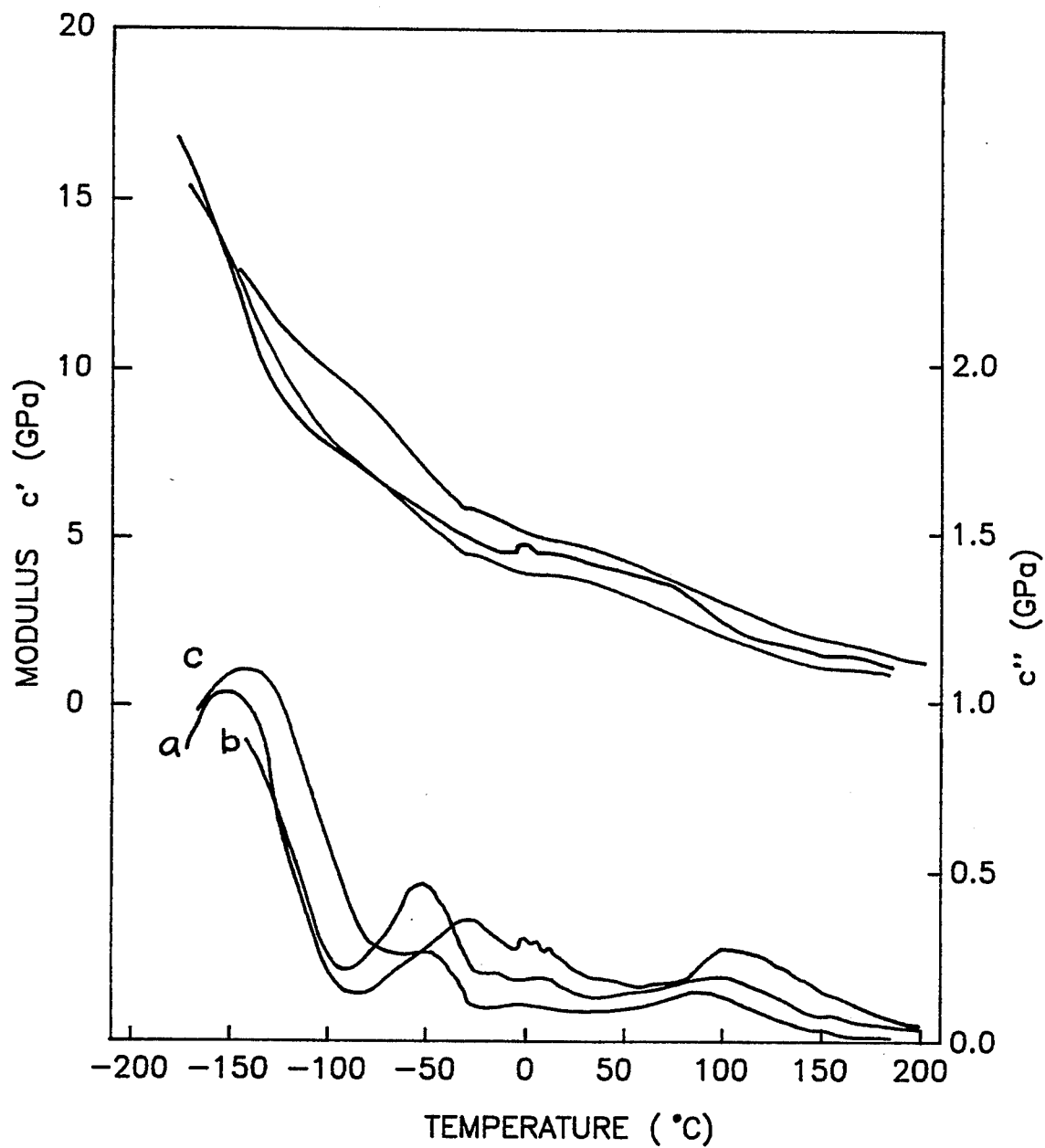
Figure 32:
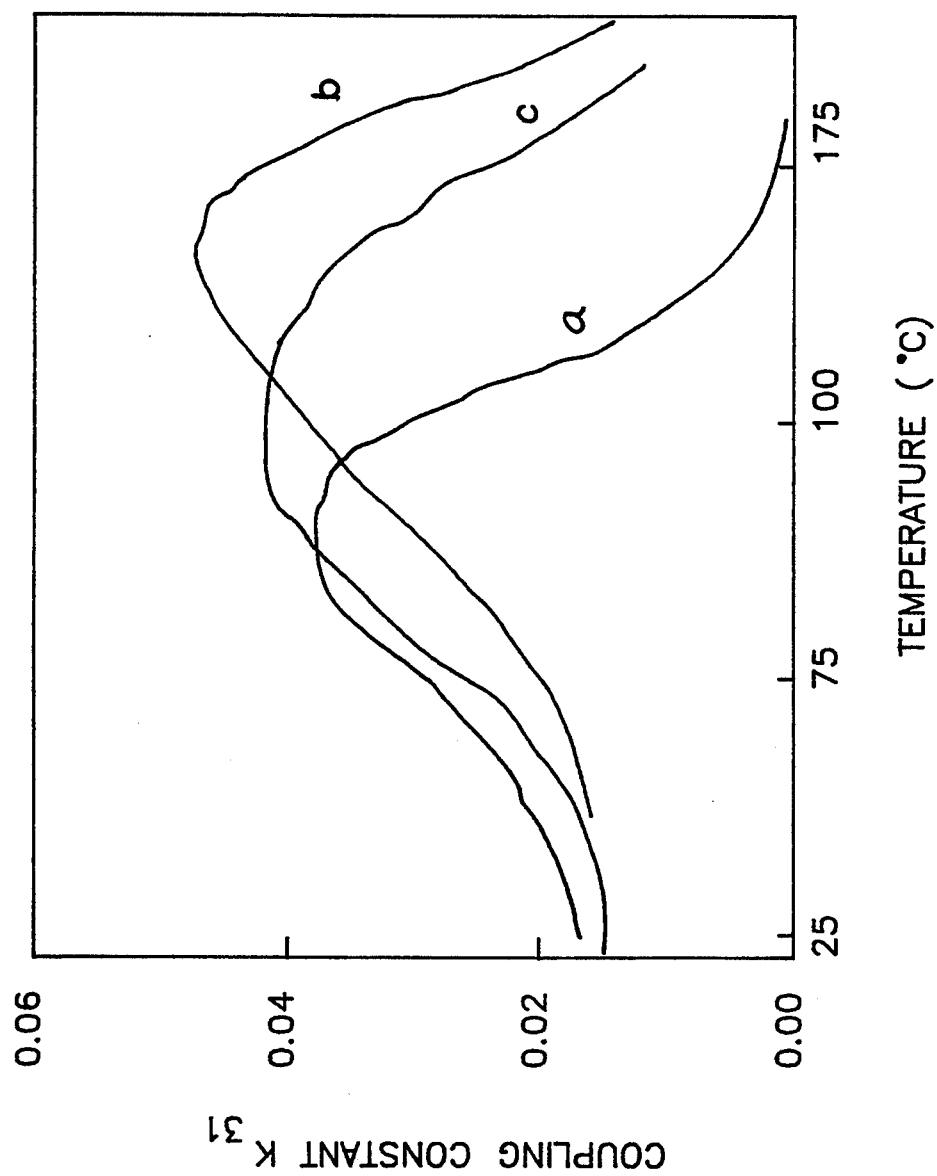

Films of Nylon-11 and Nylon-7 are prepared by melting the Nylon powder between aluminum foils in a hot press at 210° C. and 240° C. for Nylon-11 and Nylon-7 respectively. Then the molten films are quenched by placing them into an ice bath. The quenched films are then uniaxially stretched to a draw ratio of 3:1 at room temperature. The final film thickness of the sample is 10-30 micrometers. Gold electrodes (area 12-24 $mm^2$) are evaporated on opposing surfaces of the film after stretching. The evaporation process is carried out carefully in order to avoid heating the samples. Poling is then carried out at room temperature by applying a triangular shaped electric field pulse, with a maximum amplitude of 200 MV/m, to the samples so as to determine their D vs. E characteristics. The samples are placed in a silicone oil bath for these measurements and the period of the triangular voltage wave form is 1000 seconds. Before the poling procedure, the samples are pre-treated by applying a static electric field of 150-180 MV/m for a few hours for the purpose of field sweeping out most of the mobile ionic species. The Nylon-11 film is then polarized at room temperature using a field of 130 MV/m and then annealed at 185° C. for two hours. A Nylon-7 film is then polarized at room temperature using a field of 150 MV/m and then annealed at 200° C. for two hours. The temperature dependence of the piezoelectric stress and strain constant for these post annealed films are shown in FIGS. 5 and 6. Both films exhibit significant piezoelectric response in the temperature range of 100° C. to 200° C. The piezoelectric strain constant, $d'_{31}$, for Nylon-11, Nylon-7 and $PVF_2$ are measured at 104 Hz from 50° C. to temperatures close to their melting points. Stable values are shown after annealing the poled samples at 185° C. for Nylon-11 and at 200° C. for Nylon-7 for 2 hours, and after measurement up to 175° C. for $PVF_2$. The piezoelectric stress constant, $e'_{31}$, for samples of Nylon-11, Nylon-7 and $PVF_2$ are measured at 104 Hz. Similar stable values are shown. On the other hand, the $PVF_2$ sample exhibits an almost constant $d'_{31}$ and an almost linearly decreasing curve for $e'_{31}$ with increasing temperature. $PVF_2$ never reaches the highest temperatures shown since it melts at 175° C. A 0.15-2.2 uF direct current blocking capacitor is added to the input of the charge amplifier to prevent saturation while obtaining the high temperature data. From these data it is obvious that the high temperature piezoelectric characteristics of Nylon-7 and Nylon-11 are better than those of $PVF_2$.

EXAMPLE 10

Ferroelectric and Piezoelectric Polymer Blending Film. One part each of poly(vinylidene fluoride) ($PVF_2$) and vinylidene fluoride-vinyl fluoride (80/20) copolymer from Soltex Polymer Corporation and Penn-Walt Corp., respectively, are blended in a low temperature impactor under a nitrogen blanket for 10 minutes to produce a blend of 50/50 powders. The temperature is maintained at about $-190°$ C. The impactor is a model SPEX Freezer/Mill commercially available from SPEX Industries, Inc., Metuchen, N.J., U.S.A. The homogeneous powder blend is compression molded at 215° C. and quenched in the form of an aluminum foil covered sandwich in ice water to form a blending film. The film is uniaxially drawn at room temperature to a stretch ratio of 3.5:1 with a stretching rate of 1 mm/second. The stretched film has a thickness of about 25 micrometers. Gold electrodes are coated on opposing sides of the stretched film by evaporation under high vacuum condition ($10^{-6}$ torr).

The film is poled by an electric field applied with a triangular shape at room temperature (25° C.) while the film is immersed in silicone oil. The period of the triangular high voltage wave form is 1000 seconds and the maximum of the field is 150 MV/m. The poling processing is carried out for 8 cycles.

The polarized film shows the following properties:
Remanent polarization (Pr) is about 58 mC/m$^2$.
Coercive field is about 64 MV/m.
The temperature dependence of piezoelectric properties and dynamic properties are measured from $-100°$ to 120° C. at a frequency of 104.1 Hz by Rheolograph Solid ® (Toyoseiki). The properties at room temperature (25° C.) and 104.1 Hz are as follows:

Piezoelectric strain constant ($d_{31}$) is 24.7 pC/N.
Piezoelectric stress constant ($e_{31}$) is 77.0 mC/m$^2$.
Dielectric constant is 13.6.
Mechanical modulus (C) is $2.77 \times 10^9$ N/m$^2$.

The temperature dependence of piezoelectric strain constant, piezoelectric stress constant, dielectric constant and mechanical modulus are shown in FIGS. 7-12.

EXAMPLE 11

Nylon-11, commercially available from Rilsan Corporation of Glen Rock, N.J., and Nylon-7 synthesized at the Department of Materials Science, Rutgers University, are impacted separately to produce powders in a low temperature impactor which is commercially available from SPEX Industries (Metuchen, N.J.). The impactor is filled with liquid nitrogen so that the temperature is maintained at about $-190°$ C. The Nylon-11 and Nylon-7 powders are blended homogeneously with equal proportion by weight in the impactor. The homogeneous powder blend is melted between aluminum foils in a hot press at 240° C. and pressed into a thin film. The molten film is then quenched in an ice bath. The quenched film is uniaxially drawn to a draw ratio of 3 to 1. The final stretched film has a thickness of about 10-30 microns.

Gold electrodes (area 12-20 mm$^2$) are evaporated on both sides of the film and then the samples are placed in a silicone oil bath and poled by applying a triangular shaped field pulse with maximum amplitude of 200 MV/m at room temperature. The period of the triangular voltage waveform is 640 seconds. After poling, the piezoelectric strain constant, piezoelectric stress constant, dielectric constant and mechanical modulus are measured as a function of temperature at 104 Hz using a Rheolograph Solid (Toyoseiki). The first run of measurement is carried out up to a temperature of 180° C. and the samples are kept at 180° C. for a few minutes. After cooling down, the measurements are repeated and carried out up to a temperature of 190° C. The polarized blend of Nylon-11 and Nylon-7 (50%/50%) show the properties demonstrated in FIGS. 13-18.

EXAMPLE 12

Blends are produced by melt quenching mixed powders of two powder blend systems, namely polyvinylidene fluoride($PVF_2$/copolymer of polyvinylidene fluoride and trifluoride ($VF_2$-$VF_3$) and Nylon-11/Nylon-7 (50%-50% by weight) followed by uniaxial draw (3.5:1). Classic ferroelectric switching (J vs. E and D vs. E) hysteresis is shown for both blends. The piezoelectric coefficients $d_{31}$ and $e_{31}$ together with the dynamic mechanical modulus c and dielectric constant are measured as a function of temperature. For the $PVF_2$/$VF_2$-$VF_3$ blend (50% by weight), an enhancement of piezoelectric properties is observed. For the Nylon-11/Nylon-7 blend (50% by weight), this enhancement is not observed. Data are demonstrated in FIGS. 19-32.

What is claimed is:

1. A polarized material which is essentially stable to about the crystal melting temperature range of the polar crystals of the material or to about the softening temperature range or glass transition temperature range of the material if it is non-crystalline.

2. A polarized material of claim 1 in which there is distributed therein a plasticizing amount of a polarization solvent which can be removed without substantial loss in polarizing stability of the polarized material.

3. A polarized material of claim 1 wherein the dielectric constant is increased substantially by the presence therein of a dielectric constant improving solvent over the dielectric constant of said polarized material free of said solvent.

4. A polarized material of claim 3 wherein the dielectric constant is increased by at least 50 percent.

5. A polarized material of claim 1 wherein the material is a polarized poly(vinylidene fluoride) in which the polarization is essentially stable to about the crystal melting range of its polar crystals.

6. A polarized material of claim 1 wherein the material is a polarized vinylidene copolymer.

7. A polarized material of claim 1 wherein the material is a polarized poly(vinylidene fluoride/vinyl trifluoride) copolymer.

8. A polarized material of claim 1 wherein the material comprises one or more components selected from the group consisting of soluble ceramic materials, poly(vinylidene fluoride), vinylidene copolymers, Nylon-3, Nylon-5, Nylon-7, Nylon-11, and blends thereof.

9. A polarized material of claim 1 in which the material is a polymer having polymer units capable of being polarized and comprises one or more components selected from the group consisting of vinyl units, vinylidene units, ethylene units, acrylate units, methacrylate units, Nylon units, carbonate units, acrylonitrile units, cellulose units, units having pendant fluoro, chloro, amide, ester other than ester of acrylate and methacrylate units, cyanide, nitrile other than of acrylonitrile units, or ether groups, protein units or combinations thereof.

10. A method for preparing polarized material which comprises the following steps:
   a) providing a melted composition of one or more polymers in the form of a film capable of being polarized in a preselected form;
   b) quenching the melted polymeric composition;
   c) cold drawing the polymeric composition;
   d) polarizing the cold drawn polymeric composition by applying an effectively high electric field which is of less intensity than that which would cause substantial dielectric breakdown of the polymeric composition; and e) annealing the polarized polymeric composition at an annealing temperature less than the melting temperature of the crystals of the polarized polymeric composition whereby the polarization is retained and a thermal stability of the polarization is provided at or near the crystal melting point of the polar crystals of the polymeric composition.

11. The method of claim 10 wherein said composition comprises a solution of one or more polymers and a one or more solvents for said polymer or polymers.

12. The method of claim 10 wherein said polymer or polymers have polymer units capable of being polarized and comprises one or more components selected from the group consisting of vinyl units, vinylidene units, ethylene units, acrylate units, methacrylate units, Nylon units, carbonate units, acrylonitrile units, cellulose units, units having pendant fluoro, chloro, amide, ester other than ester of acrylate and methacrylate units, cyanide, nitrile other than of acrylonitrile units, or ether groups, protein units or combinations thereof.

13. The method of claim 10 wherein said composition comprises one or more components selected from the group consisting of polyvinylchloride, polymethylacrylate, polymethylmethacrylate, poly(vinylidene cyanide/vinyl acetate) copolymers, vinylidene cyanide/vinyl benzoate copolymers, vinylidene cyanide/isobutylene copolymers, vinylidene cyanide/methyl methacrylate copolymers, polyvinylfluoride, polyacrylonitrile, polycarbonate, cellulose, proteins, synthetic polymeric esters and ethers of cellulose, and poly(gamma-methyl-L-glutamate).

14. The method of claim 10 wherein said composition comprises one or more components selected from the group consisting of poly(vinylidene fluoride) and vinylidene fluoride copolymer.

15. The method of claim 14 wherein said composition comprises one or more copolymers selected from the group consisting of poly(vinylidene fluoride/trifluoroethylene), poly(vinylidene fluoride/tetrafluoroethylene), poly(vinylidene fluoride/vinyl trifluoride), poly(vinylidene fluoride/vinyl chloride) and poly(vinylidene fluoride/methylmethacrylate).

16. The method of claim 10 wherein said composition comprises one or more components selected from the group consisting of soluble ceramic materials, poly(vinylidene fluoride), vinylidene copolymers, Nylon-3, Nylon-5, Nylon-7, Nylon-9 and Nylon-11 and blends thereof.

17. The method of claim 10 wherein said composition comprises Nylon-7 and Nylon-11.

18. The method of claim 10 wherein said composition comprises about 50:50 by weight of each of Nylon-7 and Nylon-11.

19. The method of claim 10 wherein said composition comprises a melt of said polymer or polymers.

20. The method of claim 10 wherein said film comprises at least two layers of one or more polymers capable of being polarized which are formed from a multiphase composition of said polymers.

21. The method of claim 10 wherein said film comprises at least two layers of one or more polymers capable of being polarized which are co-extruded and attached to one another.

22. The method of claim 10 wherein said film comprises a self-supporting sheet of said composition.

23. The method of claim 10 wherein said film comprises a non-self-supporting layer of said composition disposed on a self supporting sheet.

24. The method of claim 10 wherein poling is conducted using a field of at least 1 Mv/cm at from about 20° C. to about 120° C. for up to about 5 hours.

25. The method of claim 10 wherein the film is annealed at a temperature of from about 185° C. to about 200° C. for at least one hour.

26. The method of claim 10 wherein the composition comprises a blend of poly(vinylidene fluoride) and vinylidene fluoride-vinyl fluoride (80/20) copolymer.

27. The method of claim 10 wherein the composition comprises a 50:50 by weight blend of poly(vinylidene fluoride) and vinylidene fluoride-vinyl fluoride (80/20) copolymer.

* * * * *